(12) United States Patent
Mitsumoto et al.

(10) Patent No.: US 10,507,563 B2
(45) Date of Patent: Dec. 17, 2019

(54) TREATMENT COMPOSITION FOR CHEMICAL MECHANICAL POLISHING, CHEMICAL MECHANICAL POLISHING METHOD, AND CLEANING METHOD

(71) Applicant: JSR CORPORATION, Minato-ku (JP)

(72) Inventors: Kiyotaka Mitsumoto, Minato-ku (JP); Tatsuyoshi Kawamoto, Minato-ku (JP); Tatsuya Yamanaka, Minato-ku (JP); Megumi Arakawa, Minato-ku (JP); Eiichirou Kunitani, Minato-ku (JP); Masashi Iida, Minato-ku (JP)

(73) Assignee: JSR CORPORATION, Minato-ku (JP)

( * ) Notice: Subject to any disclaimer, the term of this patent is extended or adjusted under 35 U.S.C. 154(b) by 232 days.

(21) Appl. No.: 15/568,285

(22) PCT Filed: Mar. 30, 2016

(86) PCT No.: PCT/JP2016/060449
§ 371 (c)(1),
(2) Date: Oct. 20, 2017

(87) PCT Pub. No.: WO2016/170942
PCT Pub. Date: Oct. 27, 2016

(65) Prior Publication Data
US 2018/0111248 A1 Apr. 26, 2018

(30) Foreign Application Priority Data

Apr. 22, 2015 (JP) ................................ 2015-087695
Apr. 22, 2015 (JP) ................................ 2015-087696
Apr. 22, 2015 (JP) ................................ 2015-087697

(51) Int. Cl.
*B24B 37/00* (2012.01)
*H01L 21/304* (2006.01)
(Continued)

(52) U.S. Cl.
CPC .............. *B24B 37/24* (2013.01); *B24B 7/228* (2013.01); *B24B 37/00* (2013.01); *B24B 37/044* (2013.01);
(Continued)

(58) Field of Classification Search
CPC ....... B24B 37/00; B24B 37/24; B24B 37/042; B24B 37/044; H01L 21/3212;
(Continued)

(56) References Cited

U.S. PATENT DOCUMENTS 6,162,368 A 12/2000 Li et al.
7,560,384 B2 7/2009 Shida et al.
(Continued)

FOREIGN PATENT DOCUMENTS

JP 2002-518845 A 6/2002
JP 2003-109921 A 4/2003
(Continued)

OTHER PUBLICATIONS

U.S. Appl. No. 11/369,870, filed Mar. 8, 2006, US 2006/0201914 A1, Uchikura et al.
(Continued)

*Primary Examiner* — Timothy V Eley
(74) *Attorney, Agent, or Firm* — Oblon, McClelland, Maier & Neustadt, L.L.P.

(57) ABSTRACT

Provided is a treatment composition for chemical mechanical polishing, for treating an object to be treated including a wiring layer containing a metal, the treatment composition for chemical mechanical polishing containing: (A) a nitrogen-containing compound; (B) at least one kind of compound selected from the group consisting of a surfactant and polyacrylic acid; and (D) a pH adjusting agent, in which in terms of electrode charge transfer resistance value obtained by AC impedance measurement using the metal for an
(Continued)

electrode, a sum of electrode charge transfer resistance values RA+RB in aqueous solutions each containing the component (A) or (B) and the component (D), and an electrode charge transfer resistance value RC in an aqueous solution containing the components (A), (B), and (D) have a relationship of RC/(RA+RB)>1.

18 Claims, 1 Drawing Sheet

(51) Int. Cl.

| | | |
|---|---|---|
| C09G 1/02 | (2006.01) | |
| C09G 1/04 | (2006.01) | |
| C11D 1/14 | (2006.01) | |
| C11D 1/22 | (2006.01) | |
| C11D 1/34 | (2006.01) | |
| C11D 3/14 | (2006.01) | |
| C11D 3/30 | (2006.01) | |
| C11D 3/33 | (2006.01) | |
| H01L 21/02 | (2006.01) | |
| H01L 21/321 | (2006.01) | |
| C11D 3/37 | (2006.01) | |
| B24B 37/24 | (2012.01) | |
| B24B 7/22 | (2006.01) | |
| C11D 1/08 | (2006.01) | |
| C11D 1/90 | (2006.01) | |
| H01L 21/768 | (2006.01) | |
| C11D 3/28 | (2006.01) | |
| C11D 7/32 | (2006.01) | |
| C11D 11/00 | (2006.01) | |
| B24B 37/04 | (2012.01) | |

(52) U.S. Cl.
CPC .................. *C09G 1/02* (2013.01); *C09G 1/04* (2013.01); *C11D 1/08* (2013.01); *C11D 1/143* (2013.01); *C11D 1/22* (2013.01); *C11D 1/345* (2013.01); *C11D 1/90* (2013.01); *C11D 3/14* (2013.01); *C11D 3/28* (2013.01); *C11D 3/30* (2013.01); *C11D 3/33* (2013.01); *C11D 3/3765* (2013.01); *C11D 7/3209* (2013.01); *C11D 7/3245* (2013.01); *C11D 7/3281* (2013.01); *C11D 11/0047* (2013.01); *H01L 21/02074* (2013.01); *H01L 21/304* (2013.01); *H01L 21/3212* (2013.01); *H01L 21/7684* (2013.01)

(58) Field of Classification Search
CPC ........... H01L 21/02074; H01L 21/7684; H01L 21/304; C11D 3/33; C11D 3/30; C11D 3/14; C11D 1/345; C11D 1/22; C11D 1/143; C11D 1/08; C11D 1/90; C11D 3/28; C11D 3/3765; C11D 7/3209; C11D 7/3245; C11D 7/3281; C11D 11/0047; C09G 1/04; C09G 1/02

See application file for complete search history.

(56) References Cited

U.S. PATENT DOCUMENTS

| | | |
|---|---|---|
| 8,119,517 B2 | 2/2012 | Shida et al. |
| 8,157,877 B2 | 4/2012 | Ikeda et al. |
| 8,262,435 B2 | 9/2012 | Kunitani et al. |
| 8,349,207 B2 | 1/2013 | Matsumoto et al. |
| 8,470,195 B2 * | 6/2013 | Kunitani .................. C09G 1/02 252/79.1 |
| 8,480,920 B2 | 7/2013 | Shida et al. |
| 8,492,276 B2 | 7/2013 | Abe et al. |
| 8,506,359 B2 | 8/2013 | Shida et al. |
| 8,574,330 B2 | 11/2013 | Namie et al. |
| 8,652,350 B2 | 2/2014 | Nishimoto et al. |
| 8,741,008 B2 | 6/2014 | Motonari et al. |
| 10,059,860 B2 * | 8/2018 | Yasui .................. B24B 37/044 |
| 2001/0000586 A1 | 5/2001 | Li et al. |
| 2003/0068893 A1 | 4/2003 | Nishida et al. |
| 2004/0262168 A1 * | 12/2004 | Huo .......................... C25F 3/02 205/676 |
| 2005/0282391 A1 | 12/2005 | Vacassy et al. |
| 2006/0201914 A1 | 9/2006 | Uchikura et al. |
| 2007/0214728 A1 | 9/2007 | Vacassy et al. |
| 2007/0266641 A1 | 11/2007 | Vacassy et al. |
| 2015/0140820 A1 | 5/2015 | Kawada et al. |
| 2015/0344739 A1 * | 12/2015 | Kamei .................. B24B 37/044 252/79.1 |
| 2018/0086943 A1 * | 3/2018 | Hayama .................. B24B 37/20 |

FOREIGN PATENT DOCUMENTS

| | | | |
|---|---|---|---|
| JP | 2007-19093 A | | 1/2007 |
| JP | 2008-503875 A | | 2/2008 |
| JP | 2010-269985 A | | 12/2010 |
| JP | 2015-43371 A | | 3/2015 |
| KR | 10-2006-0097633 A | | 9/2006 |
| TW | 201139633 A1 | | 11/2011 |
| WO | 2011/093195 A1 | | 8/2011 |
| WO | 2013/162020 A1 | | 10/2013 |

OTHER PUBLICATIONS

U.S. Appl. No. 11/433,508, filed May 15, 2006, US 2006/0276041 A1, Uchikura et al.
U.S. Appl. No. 11/563,414, filed Nov. 27, 2006, US 2007/0128874 A1, Shida et al.
U.S. Appl. No. 12/295,673, filed Dec. 31, 2008, US 2009/0124172 A1, Uchikura et al.
U.S. Appl. No. 12/295,872, filed Oct. 3, 2008, US 2009/0302266 A1, Takemura et al.
U.S. Appl. No. 12/374,074, filed Apr. 21, 2009, US 2009/0325383 A1, Andou et al.
U.S. Appl. No. 12/676,272, filed May 3, 2010, US 2010/0221918 A1, Takemura et al.
U.S. Appl. No. 12/405,327, filed Mar. 17, 2009, US 2009/0181540 A1, Shida et al.
U.S. Appl. No. 12/918,013, filed Nov. 19, 2010, US 2011/0081780 A1, Shida et al.
U.S. Appl. No. 13/165,980, filed Jun. 22, 2011, US 2011/0250756 A1, Uchikura et al.
U.S. Appl. No. 13/389,325, filed Mar. 23, 2012, US 2012/0175550 A1, Baba et al.
U.S. Appl. No. 13/576,418, filed Aug. 1, 2012, US 2013/0005219 A1, Takemura et al.
U.S. Appl. No. 14/027,500, filed Sep. 16, 2013, US 2014/0011360 A1, Namie et al.
U.S. Appl. No. 14/655,575, filed Jun. 25, 2015, US 2015/0344739 A1, Kamei et al.
U.S. Appl. No. 15/563,076, filed Sep. 29, 2017, Hayama et al.
International Search Report dated Jun. 28, 2016, in PCT/JP2016/060449, filed Mar. 30, 2016.
Oh et al., "Synthesis of Super-hydrophilic Mesoporous Silica via a Sulfonation Route", Journal of Industrial and Engineering Chemistry, vol. 12, No. 6, Nov. 2006, p. 911-917.
Office Action dated Dec. 23, 2016, in Korean Patent Application 10-2016-7030226. (with English translation).
Office Action dated Mar. 22, 2017, in Taiwan Patent Application 105 112 443. (with English translation).
Office Action dated Aug. 16, 2017, in Taiwan Patent Application 105 112 443. (with English translation).

* cited by examiner

TREATMENT COMPOSITION FOR CHEMICAL MECHANICAL POLISHING, CHEMICAL MECHANICAL POLISHING METHOD, AND CLEANING METHOD

TECHNICAL FIELD

The present invention relates to a treatment composition for chemical mechanical polishing, a chemical mechanical polishing method, and a cleaning method.

BACKGROUND ART

In recent years, along with miniaturization of a semiconductor device, a wiring layer including wiring, a plug, and the like formed in the semiconductor device has been increasingly fine. Along with this, a planarization technique through chemical mechanical polishing (hereinafter may be called "CMP") has been used for the wiring layer. As such technique, there is known, for example, a damascene process involving depositing a conductive metal, such as aluminum, copper, or tungsten, in a fine trench or hole formed in an insulating film made of silicon oxide or the like on a semiconductor substrate by a method such as sputtering or plating, and then removing an excessively deposited metal film by CMP to leave the metal only in the fine trench or hole portion (see, for example, Patent Literature 1).

In this process, tungsten, which is excellent in embedding property, is used as a material particularly for, for example, a plug to electrically connect wires to each other in an upper and lower vertical direction. In chemical mechanical polishing for forming the tungsten plug, a first polishing treatment step of mainly polishing a tungsten layer formed on an insulating film, and a second polishing treatment step of polishing the tungsten plug, a barrier metal film made of titanium or the like, and the insulating film are sequentially performed.

With regard to such chemical mechanical polishing of the tungsten layer and the tungsten plug (hereinafter may be called "tungsten film"), for example, in Patent Literature 2, as a semiconductor polishing composition to be used in a stage before finishing polishing corresponding to the first polishing treatment step, there is a disclosure of a semiconductor polishing composition that is intended to provide a high polishing rate and prevent surface roughening of a wafer surface after polishing due to high reactivity between an amine compound serving as a polishing accelerator and silicon, and that contains: abrasive grains, such as colloidal silica; a basic low-molecular-weight compound, such as an amine compound; and a water-soluble polymer compound containing a nitrogen-containing group, such as polyethyleneimine.

In addition, in Patent Literature 3, there is a disclosure of a chemical mechanical polishing method for a substrate containing tungsten, involving performing polishing using a chemical mechanical polishing composition containing: a tungsten etchant, such as an oxidizing agent; an inhibitor of tungsten etching, which is a specific polymer or the like containing a nitrogen atom, and is present in an amount of from 1 ppm to 1,000 ppm; and water. The chemical mechanical polishing composition to be used in this polishing method may contain, as optional components, an abrasive, such as colloidal silica, and compounds such as monopersulfates ($SO_5^{2-}$) and dipersulfates ($S_2O_8^{2-}$).

Meanwhile, along with extremely high integration of the semiconductor device in recent years, even contamination with an extremely small amount of impurities has largely affected the performance of the device, and by extension, a product yield. For example, on the surface of an uncleaned 8-inch wafer after completion of CMP, the number of particles each having a diameter of 0.2 μm or more to be counted is 10,000 or more, and there is a demand for removal of the particles to several to dozens of pieces through cleaning. In addition, the concentration of metal impurities (the number of impurity atoms per square centimeter) on the surface is from $1\times10^{11}$ to $1\times10^{12}$ or more, and there is a demand for removal of the metal impurities to $1\times10^{10}$ or less through the cleaning. Therefore, when CMP is introduced in the production of the semiconductor device, the cleaning after CMP is an inevitable and essential step.

Further, in an advanced node semiconductor substrate in which the tungsten layer and the tungsten plug are miniaturized, the wiring and the plug each have a size of from about several tens to about a hundred and several tens of tungsten atoms in width or diameter, and hence generation of even a fine pit at an atomic level having a diameter equivalent to several tens of tungsten atoms causes severe electrical characteristic failure. Therefore, recently, in any of a finishing polishing step (so-called polishing step), a cleaning step on a platen after polishing, and a post-cleaning step in a cleaning apparatus, there has emerged a need for a corrosion suppression technology for preventing the tungsten film from being eluted at the atomic level (see, for example, Patent Literature 4).

CITATION LIST

Patent Literature

PTL 1: JP-T-2002-518845
PTL 2: JP-A-2007-19093
PTL 3: JP-T-2008-503875
PTL 4: WO2013-162020

SUMMARY OF INVENTION

Technical Problem

However, the above-mentioned technology has not been sufficient as a tungsten film polishing composition capable of achieving the reduction of corrosion of a surface to be polished while maintaining a high polishing rate. In addition, the technology has not been sufficient as a tungsten film cleaning composition capable of achieving both the removal of foreign matter on a surface to be cleaned and the reduction of corrosion.

In view of the foregoing, according to some aspects of the invention, there are provided, by solving the above-mentioned problems, a chemical mechanical polishing composition and chemical mechanical polishing method for polishing, in a semiconductor device manufacturing process, an object to be treated, such as a semiconductor wafer, including a wiring layer containing a metal, such as tungsten, in particular, a surface to be treated of the object to be treated, where a tungsten film and an insulating film, such as a silicon oxide film, coexist, while reducing corrosion of the surface of the tungsten film without lowering a polishing rate.

There are also provided a cleaning composition capable of efficiently removing a metal oxide film and an organic residue on a surface to be treated obtained by chemical mechanical polishing using the treatment composition for chemical mechanical polishing while reducing corrosion of the surface to be treated, and a cleaning method for a substrate involving using the cleaning composition.

Solution to Problem

The invention has been made in order to solve at least part of the above-mentioned problems, and can be realized as the following aspects or application examples.

Application Example 1

A treatment composition for chemical mechanical polishing according to one aspect of the invention includes a treatment composition for chemical mechanical polishing, for treating an object to be treated including a wiring layer containing a metal, the treatment composition for chemical mechanical polishing containing:

(A) a nitrogen-containing compound;
(B) at least one kind of compound selected from the group consisting of a surfactant and polyacrylic acid; and
(D) a pH adjusting agent,
in which in terms of electrode charge transfer resistance value obtained by AC impedance measurement using the metal for an electrode, which is a value (D/cm$^2$) obtained by
bonding an insulating tape to a central 1 cm×1 cm portion of a metal wafer cut to 1 cm×3 cm,
attaching an electrode clip to an upper 1 cm×1 cm exposed area of the metal wafer,
connecting the metal wafer to a measurement apparatus with a controlled AC voltage,
immersing a lower 1 cm×1 cm exposed area of the metal wafer in an aqueous solution for 5 minutes,
applying an AC voltage having an amplitude of 5 mV and a frequency of from 1,500 Hz to 0.5 Hz changing from a higher frequency to a lower frequency to obtain values for a real part and an imaginary part of a resistance value,
plotting the imaginary part on a vertical axis and the real part on a horizontal axis, and
analyzing the resultant semicircular plot with AC impedance analysis software,
a value (RA+RB) obtained by summing up an electrode charge transfer resistance value (RA) in an aqueous solution containing the component (A) and the pH adjusting agent (D), and an electrode charge transfer resistance value (RB) in an aqueous solution containing the component (B) and the pH adjusting agent (D), and an electrode charge transfer resistance value (RC) in an aqueous solution containing the component (A), the component (B), and the pH adjusting agent (D) have a relationship of RC/(RA+RB)>1.

Application Example 2

In the above-mentioned Application Example, the nitrogen-containing compound (A) may include at least one kind selected from the group consisting of compounds represented by the following general formulae (1) to (3):

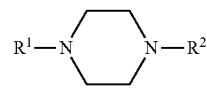

in the general formula (1), $R^1$ and $R^2$ each independently represent a functional group selected from a hydrogen atom and an organic group having 1 to 10 carbon atoms;

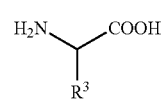

in the general formula (2), $R^3$ represents any one functional group selected from the group consisting of a hydrogen atom, an organic group having 2 to 10 carbon atoms that contains a nitrogen atom, and an organic group having 1 to 10 carbon atoms that has a carboxyl group; and

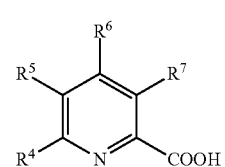

in the general formula (3), one or more of $R^4$ to $R^7$ each represent an organic group having 1 to 3 carbon atoms that has a carboxyl group, and others of $R^4$ to $R^7$ each represent a hydrogen atom.

Application Example 3

In the above-mentioned Application Examples, the component (A) may include the compound represented by the general formula (1), and the component (B) may include an anionic surfactant or polyacrylic acid.

Application Example 4

In the above-mentioned Application Examples, the anionic surfactant may include at least one kind selected from the group consisting of potassium dodecylbenzenesulfonate, a dipotassium alkenylsuccinate, and octyl phosphoric acid ester.

Application Example 5

In the above-mentioned Application Examples, the component (A) may include the compound represented by the general formula (2) in which $R^3$ represents an organic group having 2 to 10 carbon atoms that contains a nitrogen atom, and
the component (B) may include a surfactant having a sulfo group.

Application Example 6

In the above-mentioned Application Examples, the surfactant having a sulfo group may include an alkylbenzenesulfonic acid or a salt thereof.

Application Example 7

In the above-mentioned Application Examples, the component (A) may include the compound represented by the general formula (2) in which $R^3$ represents an organic group having 1 to 10 carbon atoms that has a carboxyl group, or the compound represented by the general formula (3), and
the component (B) may include a betaine-based surfactant having a carboxyl group.

Application Example 8

In the above-mentioned Application Examples, the component (B) may include at least one kind selected from the group consisting of compounds represented by the following general formulae (4), (5), and (6):

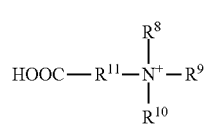
(4)

in the general formula (4), $R^8$ to $R^{10}$ each independently represent any one functional group selected from the group consisting of hydrocarbon groups each having 1 to 15 carbon atoms, and $R^{11}$ represents a hydrocarbon group having 1 to 5 carbon atoms;

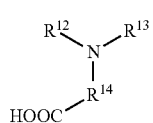
(5)

in the general formula (5), $R^{12}$ and $R^{13}$ each independently represent any one functional group selected from the group consisting of a hydrogen atom, a hydrocarbon group having 5 to 20 carbon atoms, an organic group having 5 to 20 carbon atoms that has an amide group, an organic group having 5 to 20 carbon atoms that has an amino group, an organic group having 5 to 20 carbon atoms that has an imide group, an organic group having 1 to 10 carbon atoms that has a carboxyl group, and an organic group having 1 to 10 carbon atoms that has a hydroxyl group, and $R^{14}$ represents a hydrocarbon group having 1 to 5 carbon atoms; and

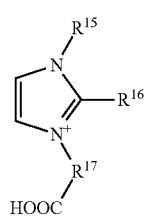
(6)

in the general formula (6), $R^{15}$ and $R^{16}$ each independently represent any one functional group selected from the group consisting of a hydrocarbon group having 1 to 20 carbon atoms, and an organic group having 1 to 10 carbon atoms that has a hydroxyl group, and $R^{17}$ represents a hydrocarbon group having 1 to 5 carbon atoms.

Application Example 9

In the above-mentioned Application Examples, the component (A) may include at least one kind selected from the group consisting of quinolinic acid, histidine, arginine, and aspartic acid, and the component (B) may include at least one kind selected from the group consisting of lauryldimethylaminoacetic acid betaine, laurylaminodipropionic acid betaine, and 2-lauryl-N-carboxymethyl-N-hydroxyethylimidazolinium betaine.

Application Example 10

In the above-mentioned Application Examples, the electrode charge transfer resistance value (RC) may be set to more than 100 $k\Omega/cm^2$.

Application Example 11

In the above-mentioned Application Examples, the metal may be tungsten.

Application Example 12

In the above-mentioned Application Examples, the treatment composition may further contain an oxidizing agent (C).

Application Example 13

In the above-mentioned Application Examples, the oxidizing agent (C) may be hydrogen peroxide or ammonium persulfate.

Application Example 14

In the above-mentioned Application Examples, the treatment composition for chemical mechanical polishing may be a cleaning composition for cleaning the object to be treated.

Application Example 15

In the above-mentioned Application Examples, the treatment composition for chemical mechanical polishing may further contain abrasive grains (E).

Application Example 16

In the above-mentioned Application Example, the treatment composition for chemical mechanical polishing may be a chemical mechanical polishing composition for polishing the object to be treated.

Application Example 17

A chemical mechanical polishing method according to one aspect of the invention includes polishing the object to be treated including a wiring layer containing a metal through use of the treatment composition for chemical mechanical polishing of Application Example 14.

Application Example 18

A cleaning method according to one aspect of the invention includes cleaning the object to be treated with the treatment composition for chemical mechanical polishing of Application Example 12.

Application Example 19

A treatment composition for chemical mechanical polishing according to another aspect of the invention includes a treatment composition for chemical mechanical polishing, for treating an object to be treated including a wiring layer containing a metal, the treatment composition for chemical mechanical polishing containing:
(A) a nitrogen-containing compound,
(B) at least one kind of compound selected from the group consisting of a surfactant and polyacrylic acid; and
(D) a pH adjusting agent.

Advantageous Effects of Invention

According to the treatment composition for chemical mechanical polishing of the invention, in a semiconductor device manufacturing process, an object to be treated, such as a semiconductor wafer, including a wiring layer containing a metal, such as tungsten, in particular, a surface to be treated of the object to be treated, where a tungsten film and an insulating film, such as a silicon oxide film, coexist, can be polished while corrosion of the surface of the tungsten film is reduced without the lowering of a polishing rate. A metal oxide film and an organic residue on the surface to be treated can also be efficiently removed while corrosion of the surface to be treated is reduced.

DESCRIPTION OF EMBODIMENTS

Figure 1:
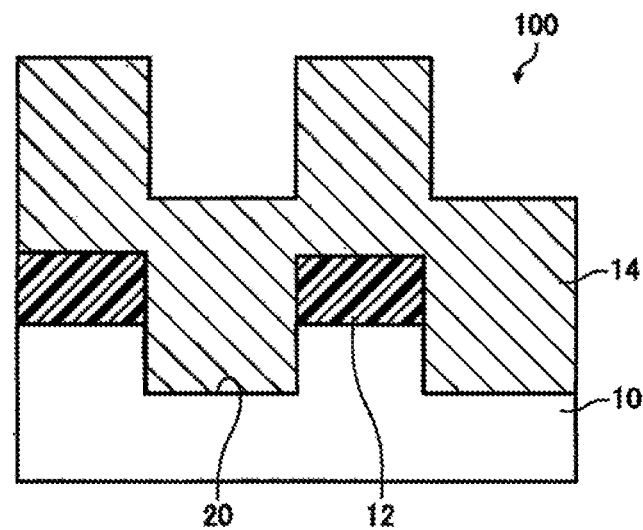
FIG. 1 is a cross-sectional view for schematically illustrating an object to be treated suitable for use in a chemical mechanical polishing method according to one embodiment of the invention.

Preferred embodiments of the invention are described in detail below. The invention is not limited to the following embodiments, and includes various modification examples performed within the range not changing the gist of the invention.

1. TREATMENT COMPOSITION FOR CHEMICAL MECHANICAL POLISHING

A treatment composition for chemical mechanical polishing according to one embodiment of the invention is a treatment composition for chemical mechanical polishing, for treating an object to be treated including a wiring layer containing a metal, the treatment composition for chemical mechanical polishing containing: (A) a nitrogen-containing compound; (B) at least one kind of compound selected from the group consisting of a surfactant and polyacrylic acid; and (D) a pH adjusting agent. In addition, the treatment composition for chemical mechanical polishing has features of satisfying specific conditions as described below.

The treatment composition for chemical mechanical polishing according to the embodiment of the invention not only can be suitably used as a "chemical mechanical polishing composition" for polishing the object to be treated with a chemical mechanical polishing method, but also can be suitably used as a "cleaning composition" for cleaning the object to be treated after chemical mechanical polishing.

That is, the treatment composition for chemical mechanical polishing according to the embodiment of the invention has the functions of both the "chemical mechanical polishing composition" and the "cleaning composition", and has features of satisfying specific conditions as described below.

Each component contained in the treatment composition for chemical mechanical polishing according to this embodiment and the like are described.

1.1. Component (A)

The treatment composition for chemical mechanical polishing according to this embodiment contains a nitrogen atom-containing compound as the component (A).

The inventors speculate that in the treatment composition for chemical mechanical polishing according to this embodiment, the component (A) acts as a complexing agent, and, through an interaction with the component (B) to be described later, forms an anticorrosive film having a multilayer structure on a surface to be treated including a wiring layer containing a metal, such as tungsten. Therefore, it is considered that when the treatment composition for chemical mechanical polishing is used as a chemical mechanical polishing composition in chemical mechanical polishing, it is possible to polish the surface to be treated while reducing corrosion of the surface to be treated without lowering a polishing rate. In addition, it is considered that when the treatment composition for chemical mechanical polishing is used as a cleaning composition after chemical mechanical polishing, it is possible to efficiently remove a metal oxide film and an organic residue on the surface to be treated while reducing corrosion of the surface to be treated.

It is preferred that the nitrogen-containing compound (A) be at least one kind selected from the group consisting of compounds represented by the following general formulae (1) to (3):

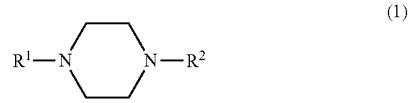
(1)

in the general formula (1), $R^1$ and $R^2$ each independently represent a functional group selected from a hydrogen atom and an organic group having 1 to 10 carbon atoms;

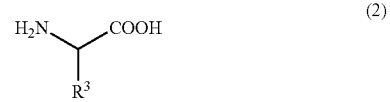
(2)

in the general formula (2), $R^3$ represents any one functional group selected from the group consisting of a hydrogen atom, an organic group having 2 to 10 carbon atoms that contains a nitrogen atom, and an organic group having 1 to 10 carbon atoms that has a carboxyl group; and

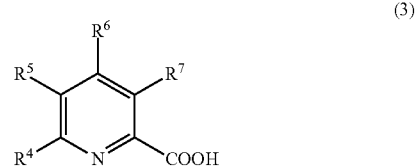
(3)

in the general formula (3), one or more of $R^4$ to $R^7$ each represent an organic group having 1 to 3 carbon atoms that has a carboxyl group, and others of $R^4$ to $R^7$ each represent a hydrogen atom.

When the component (A) is at least one kind selected from the group consisting of the compounds represented by the general formulae (1) to (3), its action as a complexing agent is improved by combination with a specific component (B) to be described later. Accordingly, a higher corrosion-reducing effect is obtained.

1.1.1. Compound Represented by General Formula (1)

When the nitrogen atom-containing compound (A) is the compound having a piperazine skeleton represented by the general formula (1), by selecting an anionic surfactant or polyacrylic acid as the component (B), it is possible to further polish or clean the surface to be treated while reducing the corrosion of the surface to be treated without lowering the polishing rate.

The organic group having 1 to 10 carbon atoms in each of $R^1$ and $R^2$ in the general formula (1) is not particularly limited, but specific examples thereof may include a hydrocarbon group having 1 to 10 carbon atoms, an organic group having 1 to 10 carbon atoms that has an amide group, an organic group having 1 to 10 carbon atoms that has an amino group, and an organic group having 1 to 10 carbon atoms that has a heterocyclic group. Of those, a hydrocarbon group having 1 to 10 carbon atoms or an organic group having 1 to 10 carbon atoms that has an amino group is preferred.

The compound represented by the general formula (1) is not particularly limited, but specific examples thereof may include piperazine, N-(2-aminoethyl)piperazine, N,N'-bis(3-propylamino)piperazine, phenylpiperazine, diphenylpiperazine, pyridinylpiperazine, and pyrimidylpiperazine. Of those, piperazine, N-(2-aminoethyl)piperazine, and N,N'-bis(3-propylamino)piperazine are preferred. The compounds described above may be used alone or in combination thereof.

1.1.2. Compound Represented by General Formula (2)

When the compound represented by the general formula (2) is used as the nitrogen atom-containing compound (A), the organic group having 2 to 10 carbon atoms that contains a nitrogen atom in $R^3$ in the general formula (2) is not particularly limited, but specific examples thereof may include an organic group having 2 to 10 carbon atoms that has an amide group, an organic group having 2 to 10 carbon atoms that has an amino group, an organic group having 2 to 10 carbon atoms that has an imide group, and an organic group having 2 to 10 carbon atoms that has a nitrogen-containing heterocyclic group. Of those, an organic group having 2 to 10 carbon atoms that has an amide group, an organic group having 2 to 10 carbon atoms that has an amino group, or an organic group having 2 to 10 carbon atoms that has a nitrogen-containing heterocyclic group is preferred. In this case, by selecting a specific component (B), it is possible to further polish or clean the surface to be treated while reducing the corrosion of the surface to be treated without lowering the polishing rate.

When the nitrogen atom-containing compound (A) is the amino acid represented by the general formula (2), $R^3$ in the compound represents an organic group having 2 to 10 carbon atoms that contains a nitrogen atom, and an alkylbenzenesulfonic acid or a salt thereof is selected as the component (B), it is possible to further polish or clean the surface to be treated while reducing the corrosion of the surface to be treated without lowering the polishing rate.

In addition, when the nitrogen atom-containing compound (A) is the amino acid represented by the general formula (2), $R^3$ in the compound represents an organic group having 1 to 10 carbon atoms that has a carboxyl group, and at least one kind selected from the group consisting of compounds represented by the general formulae (4), (5), and (6) to be described later is selected as the component (B), it is possible to further polish or clean the surface to be treated while reducing the corrosion of the surface to be treated without lowering the polishing rate.

The compound represented by the general formula (2) is not particularly limited, but a preferred specific example thereof is at least one kind selected from the group consisting of histidine, arginine, aspartic acid, glycine, alanine, and lysine. In this case, it is particularly possible to polish the surface to be treated while reducing the corrosion of the surface to be treated without lowering the polishing rate. The compounds described above may be used alone or in combination thereof.

1.1.3. Compound Represented by General Formula (3)

When the compound represented by the general formula (3) is used as the nitrogen atom-containing compound (A), by selecting, as the component (B), at least one kind selected from the group consisting of compounds represented by the general formulae (4), (5), and (6) to be described later, it is possible to further polish or clean the surface to be treated while reducing the corrosion of the surface to be treated without lowering the polishing rate.

The organic group having 1 to 3 carbon atoms that has a carboxyl group in each of $R^4$ to $R^7$ in the general formula (3) is preferably a carboxyethyl group or a carboxymethyl group. Of those, quinolinic acid is particularly preferred as the compound represented by the general formula (3). In this case, it is particularly possible to polish the surface to be treated while reducing the corrosion of the surface to be treated without lowering the polishing rate.

When the treatment composition for chemical mechanical polishing according to this embodiment is used as a chemical mechanical polishing composition for polishing the object to be treated, the content of the component (A) is 0.0001 mass % or more and 1 mass % or less, preferably 0.0005 mass % or more and 0.5 mass % or less, more preferably 0.001 mass % or more and 0.1 mass % or less with respect to the total mass of the chemical mechanical polishing composition. When the content of the component (A) falls within the above-mentioned range, it is possible to more effectively polish the surface to be treated while reducing the corrosion of the surface to be treated without lowering the polishing rate.

When the treatment composition for chemical mechanical polishing according to this embodiment is used as a cleaning composition for cleaning the object to be treated after chemical mechanical polishing, the content of the component (A) is 0.0001 mass % or more and 1 mass % or less, preferably 0.0005 mass % or more and 0.5 mass % or less, more preferably 0.001 mass % or more and 0.05 mass % or less with respect to the total mass of the cleaning composition. When the content of the component (A) falls within the above-mentioned range, it is possible to more efficiently remove a metal oxide film and an organic residue on a wiring board while reducing the corrosion of the surface to be treated.

1.2. Component (B)

The treatment composition for chemical mechanical polishing according to this embodiment contains, as the component (B), at least one kind of compound selected from the group consisting of a surfactant and polyacrylic acid. The inventors speculate that in the treatment composition for chemical mechanical polishing according to this embodiment, through the interaction between the component (B) and the above-mentioned component (A), an anticorrosive film having a multilayer structure is formed on the surface to be treated including a wiring layer containing a metal, such as tungsten. Therefore, it is considered that when, for example, the treatment composition for chemical mechanical polishing is used as a chemical mechanical polishing composition, it is possible to polish the surface to be treated while reducing the corrosion of the surface to be treated without lowering the polishing rate.

1.2.1. Anionic Surfactant and Polyacrylic Acid

When the component (A) is the compound having a piperazine skeleton represented by the general formula (1), the component (B) is preferably an anionic surfactant or polyacrylic acid. When the anionic surfactant or the polyacrylic acid is selected as the component (B), the anticorrosive film having a multilayer structure resulting from the interaction with the component (A) described above is easily formed, and hence the corrosion of the surface to be treated can be suppressed.

More specifically, the inventors speculate as follows. That is, the compound represented by the general formula (1) serving as the component (A) forms a complex on the surface to be treated and becomes cationic under an acidic condition, and hence the component (B), which is anionic, is attracted to the component (A) by an electrostatic interaction to be adsorbed. Further, alkyl carbon chains substituting the component (B) self-assemble with each other on the surface to be treated through a hydrophobic interaction, to thereby increase the thickness of an adsorption layer. Presumably as a result of the foregoing, for example, when the surface to be treated, such as tungsten, is subjected to chemical mechanical polishing using the treatment composition for chemical mechanical polishing, the surface to be treated is suppressed from being corroded by an oxidizing agent serving as an etchant more than necessary.

By such expression mechanism, the treatment composition for chemical mechanical polishing according to this embodiment expresses a dramatically high corrosion-suppressing effect on the surface to be treated as compared to the case of using each of the component (A) and the component (B) alone as a corrosion-suppressing agent. As described above, it is considered that the treatment composition for chemical mechanical polishing according to the embodiment of the invention achieves the suppression of the corrosion of the surface to be treated by virtue of the coexistence of the component (A), which is a complexing agent, and the component (B), which is an anionic compound.

The anionic surfactant to be used as the component (B) in this case is not particularly limited, but specific examples thereof include carboxylic acid salts, sulfonic acid salts, succinic acid salts, sulfate salts, and phosphate salts. The carboxylic acid salts are not particularly limited, but specific examples thereof include fatty acid soaps and alkyl ether carboxylic acid salts. The sulfonic acid salts are not particularly limited, but specific examples thereof include alkylbenzenesulfonic acid salts, alkylnaphthalenesulfonic acid salts, and α-olefin sulfonic acid salts. The succinic acid salts are not particularly limited, but specific examples thereof include alkenyl succinic acid salts. The sulfate salts are not particularly limited, but specific examples thereof include higher alcohol sulfate salts and alkyl sulfate salts. The phosphates are not particularly limited, but specific examples thereof include alkyl phosphates. Of those, potassium dodecylbenzenesulfonate, a dipotassium alkenylsuccinate, and octyl phosphoric acid ester are particularly preferred. The compounds described above may be used alone or in combination thereof.

1.2.2. Surfactant Having Sulfo Group

When the component (A) is the compound represented by the general formula (2) in which $R^3$ represents an organic group having 2 to 10 carbon atoms that contains a nitrogen atom, the component (B) is preferably a surfactant having a sulfo group. When the surfactant having a sulfo group is selected as the component (B), the anticorrosive film having a multilayer structure resulting from the interaction with the component (A) is easily formed, and for example, in the case of using the treatment composition for chemical mechanical polishing as a chemical mechanical polishing composition, it is possible to polish the surface to be treated while reducing the corrosion of the surface to be treated without lowering the polishing rate.

More specifically, the inventors speculate as follows. That is, the compound represented by the general formula (2) serving as the component (A) becomes cationic under an acidic condition sufficiently lower than an isoelectric point, and hence the component (B), which is anionic, adsorbs to the component (A) by virtue of an electrostatic interaction. Further, alkyl carbon chains substituting the component (B) self-assemble with each other on the surface to be treated through a hydrophobic interaction, to thereby increase the thickness of an adsorption layer. Presumably as a result of the foregoing, for example, when the surface to be treated, such as tungsten, is subjected to chemical mechanical polishing using the treatment composition for chemical mechanical polishing, the surface to be treated is suppressed from being corroded by an oxidizing agent serving as an etchant more than necessary.

By such expression mechanism, the treatment composition for chemical mechanical polishing according to this embodiment expresses a dramatically high corrosion-suppressing effect on the surface to be treated as compared to the case of using each of the component (A) and the component (B) alone as a corrosion-suppressing agent. As described above, it is considered that the treatment composition for chemical mechanical polishing according to the embodiment of the invention achieves the suppression of the corrosion of the surface to be treated by virtue of the coexistence of the component (A), which is a complexing agent, and the component (B), which is a surfactant having a sulfo group.

The surfactant having a sulfo group to be used as the component (B) is not particularly limited, but specific examples thereof include alkylbenzenesulfonic acid salts, alkylnaphthalenesulfonic acid salts, α-olefin sulfonic acid salts, and sulfate salts. The sulfate salts are not particularly limited, but specific examples thereof include higher alcohol sulfate salts and alkyl sulfate salts. Of those, an alkylbenzenesulfonic acid or a salt thereof is preferred, and dodecylbenzenesulfonic acid or a salt thereof is particularly preferred.

1.2.3. Betaine-Based Surfactant Having Carboxyl Group

When the component (A) is the compound represented by the general formula (2) in which $R^3$ represents an organic group having 1 to 10 carbon atoms that has a carboxyl group, or the compound represented by the general formula (3), it is preferred that at least one kind selected from the group consisting of compounds represented by the following general formulae (4), (5), and (6) be selected as the component (B). In this case, the anticorrosive film having a multilayer structure resulting from the interaction with the component (A) is easily formed, and for example, in the case of using the treatment composition for chemical mechanical polishing as a chemical mechanical polishing composition, it is possible to polish the surface to be treated while reducing the corrosion of the surface to be treated without lowering the polishing rate.

More specifically, the inventors speculate as follows. That is, first, the component (A) serving as a complexing agent forms a complex on a tungsten surface. Then, with respect to a carboxyl group of the component (A), the component (B), which also has a carboxyl group, forms a complementary hydrogen bond, and thus a two-layer film formed of the component (A) and the component (B) is formed on the surface to be treated. Further, alkyl carbon chains of the component (B) self-assemble with each other on the surface to be treated through a hydrophobic interaction, to thereby increase the thickness of an adsorption layer. Presumably as a result of the foregoing, for example, when the surface to be treated, such as tungsten, is subjected to chemical mechanical polishing using the treatment composition for chemical mechanical polishing, the surface to be treated is suppressed from being corroded by an oxidizing agent serving as an etchant more than necessary.

By such expression mechanism, the treatment composition for chemical mechanical polishing according to this embodiment expresses a dramatically high corrosion-suppressing effect on the surface to be treated as compared to the case of using each of the component (A) and the component (B) alone as a corrosion-suppressing agent. As described above, it is considered that the treatment composition for chemical mechanical polishing according to the embodiment of the invention achieves the suppression of the corrosion of the surface to be treated by virtue of the coexistence of the component (A), which is a complexing agent, and the component (B), which is a betaine-based surfactant.

The betaine-based surfactant having a carboxyl group to be used as the component (B) is not particularly limited, but a preferred specific example thereof is at least one kind selected from the group consisting of compounds represented by the following formula (3), formula (4), and formula (5):

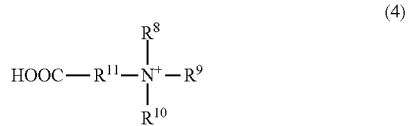

(4)

in the general formula (4), $R^8$ to $R^{10}$ each independently represent any one functional group selected from the group consisting of hydrocarbon groups each having 1 to 15 carbon atoms, and $R^{11}$ represents a hydrocarbon group having 1 to 5 carbon atoms;

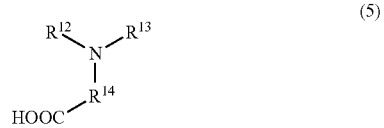

(5)

in the general formula (5), $R^{12}$ and $R^{13}$ each independently represent any one functional group selected from the group consisting of a hydrogen atom, a hydrocarbon group having 5 to 20 carbon atoms, an organic group having 5 to 20 carbon atoms that has an amide group, an organic group having 5 to 20 carbon atoms that has an amino group, an organic group having 5 to 20 carbon atoms that has an imide group, an organic group having 1 to 10 carbon atoms that has a carboxyl group, and an organic group having 1 to 10 carbon atoms that has a hydroxyl group, and $R^{14}$ represents a hydrocarbon group having 1 to 5 carbon atoms; and

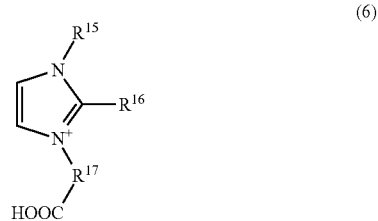

(6)

in the general formula (6), $R^{15}$ and $R^{16}$ each independently represent any one functional group selected from the group consisting of a hydrocarbon group having 1 to 20 carbon atoms, and an organic group having 1 to 10 carbon atoms that has a hydroxyl group, and $R^{17}$ represents a hydrocarbon group having 1 to 5 carbon atoms.

The hydrocarbon group having 1 to 15 carbon atoms in each of $R^8$ to $R^{10}$ in the general formula (4) is not particularly limited, but specific examples thereof may include an alkyl group having 1 to 15 carbon atoms that may be linear or branched, and a cyclic hydrocarbon group having 3 to 15 carbon atoms. Of those, an alkyl group having 1 to 15 carbon atoms that may be linear or branched is preferred, and it is particularly preferred that at least one of $R^8$ to $R^{10}$ represent a linear alkyl group having 5 to 15 carbon atoms.

A carboxyethyl group or a carboxymethyl group is preferred as the organic group having 1 to 10 carbon atoms that has a carboxyl group in the general formula (5).

Of those, at least one kind selected from the group consisting of lauryldimethylaminoacetic acid betaine, laurylaminodipropionic acid betaine, and 2-lauryl-N-carboxymethyl-N-hydroxyethylimidazolinium betaine is particularly preferred as the component (B). In this case, the suppression of the corrosion of the surface to be treated is particularly achieved.

When the treatment composition for chemical mechanical polishing according to this embodiment is used as a chemical mechanical polishing composition for polishing the object to be treated, the content of the component (B) is 0.0001 mass % or more and 1 mass % or less, preferably 0.0005 mass % or more and 0.5 mass % or less, more preferably 0.001 mass % or more and 0.1 mass % or less with respect to the total mass of the chemical mechanical polishing composition. When the content of the component (B) falls within the above-mentioned range, it is possible to more effectively polish the surface to be treated while reducing the corrosion of the surface to be treated without lowering the polishing rate.

A ratio between the component (A) and the component (B) is preferably from 1:20 to 40:1, more preferably from 1:10 to 20:1. When the ratio between the component (A) and the component (B) falls within the above-mentioned range, it is possible to more effectively polish the surface to be treated while reducing the corrosion of the surface to be treated without lowering the polishing rate.

When the treatment composition for chemical mechanical polishing according to this embodiment is used as a cleaning composition for cleaning the object to be treated after chemical mechanical polishing, the content of the component (B) is 0.0001 mass % or more and 1 mass % or less, preferably 0.0005 mass % or more and 0.5 mass % or less, more preferably 0.001 mass % or more and 0.05 mass % or less with respect to the total mass of the cleaning composition. When the content of the component (A) falls within the above-mentioned range, it is possible to more efficiently remove the metal oxide film and the organic residue on the wiring board while reducing the corrosion of the surface to be treated.

A ratio between the component (A) and the component (B) is preferably from 1:20 to 40:1, more preferably from 1:10 to 20:1. When the ratio between the component (A) and the component (B) falls within the above-mentioned range, it is possible to more efficiently remove the metal oxide film and the organic residue on the wiring board while reducing the corrosion of the surface to be treated.

1.3. Oxidizing Agent (C)

When the treatment composition for chemical mechanical polishing according to this embodiment is used as a chemical mechanical polishing composition for polishing the object to be treated, the treatment composition for chemical mechanical polishing may further contain an oxidizing agent (C). It is considered that the following effect is obtained when the chemical mechanical polishing composition according to this embodiment contains the oxidizing agent (C): the surface to be treated including a wiring layer containing a metal, such as tungsten, is oxidized to promote a complexation reaction with a polishing liquid component, to thereby form a brittle modified layer on the surface to be treated, and thus polishing is facilitated.

The oxidizing agent (C) is not particularly limited, but specific examples thereof include ammonium persulfate, potassium persulfate, hydrogen peroxide, ferric nitrate, diammonium cerium nitrate, iron sulfate, hypochlorous acid, ozone, potassium periodate, and peracetic acid. Those oxidizing agents (C) may be used alone or in combination thereof. In addition, of those oxidizing agents (C), ammonium persulfate or hydrogen peroxide is preferred in consideration of, for example, oxidizing power, compatibility with a protective film, and ease of handling.

When the treatment composition for chemical mechanical polishing according to this embodiment is used as a chemical mechanical polishing composition, the content of the oxidizing agent (C) is 0.01 mass % or more and it mass % or less, preferably 0.05 mass % or more and 8 mass % or less, more preferably 0.1 mass % or more and 5 mass % or less with respect to the total mass of the chemical mechanical polishing composition.

When the treatment composition for chemical mechanical polishing according to this embodiment is used as a cleaning composition for cleaning the object to be treated after chemical mechanical polishing, the content of the oxidizing agent (C) is 0 mass % or more and 1 mass % or less, preferably 0 mass % or more and 0.05 mass % or less, more preferably 0 mass % or more and 0.01 mass % or less with respect to the total mass of the cleaning composition.

1.4. pH Adjusting Agent (D)

The treatment composition for chemical mechanical polishing according to this embodiment contains a pH adjusting agent. The pH adjusting agent is not particularly limited, but specific examples thereof include acidic compounds, such as maleic acid, nitric acid, and phosphoric acid. The pH of the treatment composition for chemical mechanical polishing according to this embodiment is not particularly limited, but is preferably 1 or more and 6 or less, more preferably 1 or more and 5 or less. When the pH falls within the above-mentioned range, the storage stability of the treatment composition for chemical mechanical polishing is satisfactory. In addition, when, for example, the treatment composition for chemical mechanical polishing according to this embodiment is used as a chemical mechanical polishing composition for polishing the object to be treated, it is possible to polish the surface to be treated, where a tungsten film and an insulating film, such as a silicon oxide film, coexist, while reducing the corrosion of the surface to be treated without lowering the polishing rate on the surface to be treated. The content of the pH adjusting agent may be appropriately adjusted so that the above-mentioned pH may be obtained, and is preferably 0.1 mass % or more and 3 mass % or less, more preferably 0.2 mass % or more and 2 mass % or less, particularly preferably 0.3 mass % or more and 1 mass % or less with respect to the total mass of the treatment composition for chemical mechanical polishing.

1.5. (E) Abrasive Grains

When the treatment composition for chemical mechanical polishing according to this embodiment is used as a chemical mechanical polishing composition for polishing the object to be treated, the treatment agent for chemical mechanical polishing according to this embodiment may further contain abrasive grains (E). The abrasive grains (E) are not particularly limited, but specific examples thereof include inorganic particles, such as silica particles, ceria particles, alumina particles, zirconia particles, and titania particles.

The silica particles are not particularly limited, but specific examples thereof include colloidal silica and fumed silica. Of those, colloidal silica is preferred. The colloidal silica is used preferably from the viewpoint of reducing polishing defects, such as a scratch, and for example, one produced by a method disclosed in JP-A-2003-109921 may be used. In addition, colloidal silica surface-modified by a method disclosed in JP-A-2010-269985, J. Ind. Eng. Chem., Vol. 12, No. 6, (2006) 911-917, or the like may be used.

In particular, sulfonic acid-modified colloidal silica obtained by introducing a sulfo group into the surface of colloidal silica is excellent in stability under an acidic condition, and hence is suitably used in the invention. As a method of introducing a sulfo group into the surface of colloidal silica, there is given a method involving modifying the surface of colloidal silica with a silane coupling agent having a functional group capable of being chemically converted to a sulfo group, and then converting the functional group to a sulfo group. Examples of such silane coupling agent include: silane coupling agents each having a mercapto group, such as 3-mercaptopropyltrimethoxysilane, 2-mercaptoethyltrimethoxysilane, and 2-mercaptoethyltriethoxysilane; and silane coupling agents each having a sulfide group, such as bis(3-trietboxysilylpropyl)disulfide. The mercapto group or the sulfide group of the silane coupling agent with which the surface of colloidal silica is modified can be converted to a sulfo group by being oxidized.

The content of the abrasive grains (E) is (0.1 mass % or more and 10 mass % or less, preferably 0.1 mass % or more and 8 mass % or less, more preferably 0.1 mass % or more and 7 mass % or less with respect to the total mass of the treatment composition for chemical mechanical polishing. When the content of the abrasive grains (E) falls within the above-mentioned range, a practical polishing rate of a tungsten film can be achieved.

1.6. Aqueous Medium

The treatment composition for chemical mechanical polishing according to this embodiment contains an aqueous medium. Water is more preferably used as the aqueous medium.

1.7. Other Additives

The treatment composition for chemical mechanical polishing according to this embodiment may have further added thereto additives, such as a surfactant other than the above-mentioned surfactant, a water-soluble polymer, and a corrosion inhibitor, as necessary. Each additive will be described below.

1.7.1. Surfactant

The treatment composition for chemical mechanical polishing according to this embodiment may have further added thereto a surfactant as necessary as long as the combination of the component (A) and the component (B) is not overlapped. The surfactant has an effect of imparting an appropriate viscous property to the treatment composition for chemical mechanical polishing. The viscosity of the treatment composition for chemical mechanical polishing is preferably adjusted so as to be 0.5 mPa·s or more and 2 mPa·s or less at 25° C.

The surfactant is not particularly limited, and examples thereof include a cationic surfactant, a non-ionic surfactant, an amphoteric surfactant, and an anionic surfactant.

The cationic surfactant is not particularly limited, but specific examples thereof include aliphatic amine salts and aliphatic ammonium salts.

The non-ionic surfactant is not particularly limited, but specific examples thereof include an ether-type surfactant, an ether ester-type surfactant, an ester-type surfactant, and an acetylene-based surfactant. The ether ester-type surfactant is not particularly limited, but a specific example thereof is a polyoxyethylene ether of a glycerin ester. The ester-type surfactant is not particularly limited, but specific examples thereof include a polyethylene glycol fatty acid ester, a glycerin ester, and a sorbitan ester. The acetylene-based surfactant is not particularly limited, but specific examples thereof include ethylene oxide adducts of acetylene alcohol, acetylene glycol, and acetylene diol.

The amphoteric surfactant is not particularly limited, but specific examples thereof include betaine-based surfactants.

The anionic surfactant is not particularly limited, but specific examples thereof include carboxylic acid salts, sulfonic acid salts, sulfate salts, and phosphate salts. The carboxylic acid salts are not particularly limited, but specific examples thereof include fatty acid soaps and alkyl ether carboxylic acid salts. Examples of the sulfonic acid salts include alkylbenzenesulfonic acid salts, alkylnaphthalene-sulfonic acid salts, and α-olefin sulfonic acid salts. The sulfate salts are not particularly limited, but specific examples thereof include higher alcohol sulfate salts and alkyl sulfate salts. The phosphates are not particularly limited, but specific examples thereof include alkyl phosphates.

Those surfactants may be used alone or in combination thereof.

When the treatment composition for chemical mechanical polishing according to this embodiment is used as a chemical mechanical polishing composition for polishing the object to be treated, the content of the surfactant is 0.001 mass % or more and 1 mass % or less, preferably 0.002 mass % or more and 0.8 mass % or less, more preferably 0.003 mass % or more and 0.5 mass % or less with respect to the total mass of the chemical mechanical polishing composition. When the addition amount of the surfactant falls within the above-mentioned range, a smooth polished surface can be more effectively obtained after the removal of the silicon oxide film by polishing.

When the treatment composition for chemical mechanical polishing according to this embodiment is used as a cleaning composition for cleaning the object to be treated after chemical mechanical polishing, the content of the surfactant is 0.001 mass % or more and 1 mass % or less, preferably 0.002 mass % or more and 0.8 mass % or less, more preferably 0.003 mass % or more and 0.5 mass % or less with respect to the total mass of the cleaning composition. When the addition amount of the surfactant falls within the above-mentioned range, it is possible to efficiently remove the organic residue while reducing the corrosion of the surface to be treated after the removal of the silicon oxide film by polishing.

1.7.2. Water-Soluble Polymer

The treatment composition for chemical mechanical polishing according to this embodiment may have further added thereto a water-soluble polymer as necessary. It is considered that the water-soluble polymer has a function of adsorbing onto the surface of the surface to be polished to reduce polishing friction. Thus, when the treatment composition for chemical mechanical polishing according to this embodiment is used as a chemical mechanical polishing composition for polishing the object to be treated, the addition of the water-soluble polymer can suppress the occurrence of dishing or corrosion in some cases.

The water-soluble polymer is not particularly limited, but specific examples thereof include polyacrylamide, polyvinyl alcohol, polyvinylpyrrolidone, and hydroxyethyl cellulose, provided that polyacrylic acid is excluded.

The addition amount of the water-soluble polymer may be adjusted so that the viscosity of the treatment composition for chemical mechanical polishing may be 2 mPa·s or less. When the viscosity of the treatment composition for chemical mechanical polishing is 2 mPa·s or less, the treatment composition for chemical mechanical polishing can be stably supplied onto an abrasive cloth more effectively. As a result, an increase in temperature of the abrasive cloth, polishing non-uniformity (deterioration in in-plane uniformity), and the like may be less liable to occur, and variations in polishing rate and dishing may be less liable to occur.

1.7.3. Corrosion Inhibitor

The treatment composition for chemical mechanical polishing according to this embodiment may have further added thereto a corrosion inhibitor as necessary. The corrosion inhibitor is not particularly limited, but specific examples thereof include benzotriazole and a derivative thereof. Herein, the benzotriazole derivative refers to a product obtained by substitution of one or two or more hydrogen atoms in benzotriazole with, for example, a carboxyl group, a methyl group, an amino group, or a hydroxyl group. Examples of the benzotriazole derivative include 4-carboxylbenzotriazole and salts thereof, 7-carboxybenzotriazole and salts thereof, benzotriazole butyl esters, 1-hydroxymethylbenzotriazole, and 1-hydroxybenzotriazole.

When the treatment composition for chemical mechanical polishing according to this embodiment is used as a chemical mechanical polishing composition for polishing the object to be treated, and the treatment composition for chemical mechanical polishing according to this embodiment is used as a cleaning composition for cleaning the object to be treated after chemical mechanical polishing, the addition amount of the corrosion inhibitor is 0.001 mass % or more and 1 mass % or less, preferably 0.002 mass % or more and 0.8 mass % or less, more preferably 0.003 mass % or more and 0.5 mass % or less with respect to the total mass of the composition.

1.8. Electrode Charge Transfer Resistance Value

The treatment composition for chemical mechanical polishing according to this embodiment is such that in an electrode charge transfer resistance value obtained by AC impedance measurement using the metal for an electrode, a value (RA+RB) obtained by summing up an electrode charge transfer resistance value (RA) in an aqueous solution containing the component (A) and the pH adjusting agent (D), and an electrode charge transfer resistance value (RB) in an aqueous solution containing the component (B) and the pH adjusting agent (D), and an electrode charge transfer resistance value (RC) in an aqueous solution containing the component (A), the component (B), and the pH adjusting agent (D) have a relationship of RC/(RA+RB)>1. The charge transfer resistance value is a resistance component derived from corrosion of the metal at an interface between the metal and a solution among resistance components appearing when an AC impedance measurement apparatus, the metal, and the solution are electrically conducted to form a circuit. In addition, the charge transfer resistance value corresponds to the reciprocal value of the corrosion rate of the metal. That is, a large charge transfer resistance value is an indicator of a low corrosion rate of the metal. When the anticorrosive film to be formed on the metal surface is increased in thickness, a cause of corrosion, i.e., erosion by an oxidizing agent, an etching component, or the like is inhibited, and hence the charge transfer resistance value increases. In view of this, obtaining a large charge transfer resistance value is generally recognized as an effort to form a thick anticorrosive film on the metal surface.

The case in which the electrode charge transfer resistance values satisfy the relationship of RC/(RA+RB)>1 means that the electrode charge transfer resistance value (RC) of a treatment composition for chemical mechanical polishing containing both the component (A) and the component (B) is a higher resistance value than the sum (RA+RB) of the electrode charge transfer resistance values (RA, RB) of treatment compositions for chemical mechanical polishing containing the component (A) or the component (B) alone. That is, as described above, in such a treatment composition for chemical mechanical polishing that the component (A) and the component (B) form an anticorrosive film having a multilayer structure through the interaction between the two compounds instead of each individually having a corrosion suppression action, the electrode charge transfer resistance value (RC) that is higher than the sum (RA+RB) of the electrode charge transfer resistance values (RA, RB) of the treatment compositions for chemical mechanical polishing containing the component (A) or the component (B) alone is obtained, and corrosion can be dramatically suppressed as compared to the case of using the component (A) or the component (B) alone for a metal corrosion-suppressing agent.

The electrode charge transfer resistance value obtained by the AC impedance measurement using the metal for an electrode is a value (l/cm) obtained by: bonding an insulating tape to a central 1 cm×1 cm portion of a metal wafer cut to 1 cm×3 cm, attaching an electrode clip to an upper 1 cm 1 cm exposed area of the metal wafer; connecting the metal wafer to a measurement apparatus with a controlled AC voltage; immersing a lower 1 cm×1 cm exposed area of the metal wafer in an aqueous solution for 5 minutes; applying an AC voltage having an amplitude of S mV and a frequency of from 1,500 Hz to 0.5 Hz changing from a higher frequency to a lower frequency to obtain values for the real part and the imaginary part of a resistance value; plotting the imaginary part on a vertical axis and the real part on a horizontal axis; and analyzing the resultant semicircular plot with AC impedance analysis software. As an apparatus for measuring an electrode charge transfer resistance, there is used, for example, a potentio/galvanostat (manufactured by Solartron Analytical, SI 1287) with a frequency response analyzer (manufactured by Solartron Analytical, Model 1252A FRA) connected thereto. More specifically, an insulating tape is bonded to a central 1 cm×1 cm portion of a tungsten cut wafer cut to 1 cm×3 cm, an electrode clip is attached to an upper 1 cm×1 cm exposed area of the wafer, the wafer is connected to a measurement apparatus with a controlled AC voltage, and a lower 1 cm×1 cm exposed area of the wafer is immersed in the treatment composition for chemical mechanical polishing serving as a measurement object. After a lapse of 5 minutes of immersion, an AC voltage having an amplitude of 5 mV and a frequency of from 1,500 Hz to 0.5 Hz changing from a higher frequency to a lower frequency is applied to obtain values for the real part and the imaginary part of a resistance value, the imaginary part and the real part are plotted on a vertical axis and a horizontal axis, respectively, and the resultant semicircular plot is analyzed with AC impedance analysis software "ZView" manufactured by Solartron Analytical. Thus, the electrode charge transfer resistance value ($\Omega/cm^2$) can be calculated.

The electrode charge transfer resistance value (RC) of the treatment composition for chemical mechanical polishing containing both the component (A) and the component (B) is preferably more than 100 kW/cm$^2$. In this case, the corrosion-suppressing effect on the surface to be treated containing tungsten or the like is increased. When the electrode charge transfer resistance value (RC) is 100 k$\Omega$/cm$^2$ or less, the oxidation rate of the surface to be treated is high, and hence the corrosion-suppressing effect on the surface to be treated is hardly obtained.

1.9. Applications

The treatment composition for chemical mechanical polishing according to this embodiment can be suitably used as a chemical mechanical polishing composition in polishing of a wiring board serving as the object to be treated in CMP. As described above, when both the component (A) and the component (B) are used, the corrosion-suppressing effect on the surface to be treated is dramatically increased. Therefore, the treatment composition for chemical mechanical polishing according to this embodiment is suitable as a polishing agent for polishing, in a semiconductor device manufacturing process, an object to be treated, such as a semiconductor wafer, including a wiring layer containing a metal, such as tungsten, in particular, the surface to be treated of the object to be treated, where a tungsten film and an insulating film, such as a silicon oxide film, coexist, while reducing the corrosion of the surface of the tungsten film without lowering the polishing rate.

In addition, the treatment composition for chemical mechanical polishing according to this embodiment can be suitably used as a cleaning composition in cleaning of a wiring board after the completion of CMP. As described above, when both the component (A) and the component (B) are used, the corrosion-suppressing effect on the surface to be treated is dramatically increased. Therefore, the treatment composition for chemical mechanical polishing according to this embodiment is suitable as a cleaning agent for efficiently removing an oxide film and an organic residue on a wiring board while reducing the corrosion of a tungsten film surface that is the surface to be treated after chemical mechanical polishing.

1.10. Method of Preparing Treatment Composition for Chemical Mechanical Polishing The treatment composition for chemical mechanical polishing according to this embodiment may be prepared by dissolving or dispersing the above-mentioned components in an aqueous medium, such as water. A method of dissolving or dispersing the components is not particularly limited, and any method may be applied as long as the components can be uniformly dissolved or dispersed. Besides, the mixing order of the above-mentioned components and a method of mixing the components are also not particularly limited.

In addition, at the time of use, the treatment composition for chemical mechanical polishing according to this embodiment may be used after having been diluted with a dispersion medium, such as water.

2. TREATMENT METHOD

A treatment method according to an embodiment of the invention includes subjecting an object to be treated including a wiring layer containing a metal, such as tungsten, which is a component of a semiconductor device, to chemical mechanical polishing or cleaning treatment through use of the above-mentioned treatment composition for chemical mechanical polishing according to the invention. A chemical mechanical polishing method and cleaning method according to this embodiment are not particularly limited, but one specific example is described in detail below with reference to the drawings.

2.1. Object to be Treated

FIG. 1 is a cross-sectional view for schematically illustrating an object to be treated suitable for use in the chemical mechanical polishing method according to this embodiment. An object 100 to be treated is formed through the following steps (1) to (4).

(1) First, a silicon substrate 10 is prepared. The silicon substrate 10 may have formed thereon a functional device, such as a transistor (not shown).

(2) A silicon oxide film 12 is formed by using a CVD method or a thermal oxidation method on the silicon substrate 10.

(3) The silicon oxide film 12 is patterned. With the use of the pattern as a mask, a wiring depression 20 is formed in the silicon oxide film 12 by applying, for example, an etching method.

(4) A tungsten film 14 is deposited by a sputtering method so as to fill the wiring depression 20, the object 100 to be treated is obtained.

2.2. Polishing Step

Through use of, for example, the above-mentioned chemical mechanical polishing composition among the above-mentioned treatment compositions for chemical mechanical polishing, the tungsten film 14 deposited on the silicon oxide film 12 of the object 100 to be treated is removed by polishing, and then a tungsten plug, a barrier metal film made of titanium or the like, and an insulating film are polished. According to the chemical mechanical polishing method according to this embodiment, through use of the above-mentioned treatment composition for chemical mechanical polishing as a chemical mechanical polishing composition, it is possible to polish the surface to be treated, where the tungsten film and the insulating film, such as the silicon oxide film, coexist, while reducing the corrosion of the surface of the tungsten film without lowering the polishing rate.

Figure 2:
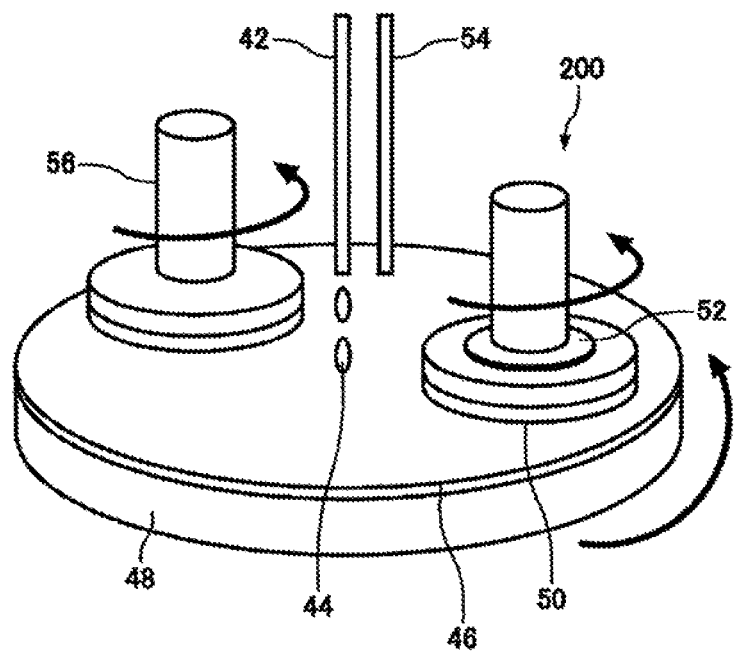
FIG. 2 is a perspective view for schematically illustrating a chemical mechanical polishing apparatus suitable for use in a chemical mechanical polishing method according to one embodiment of the invention.

For the above-mentioned polishing step, for example, a chemical mechanical polishing apparatus 200 as illustrated in FIG. 2 may be used. FIG. 2 is a perspective view for schematically illustrating the chemical mechanical polishing apparatus 200. The above-mentioned polishing step is performed by supplying a slurry (chemical mechanical polishing composition) 44 from a slurry supply nozzle 42, and while rotating a turntable 48 having attached thereto an abrasive cloth 46, bringing a carrier head 52 holding a semiconductor substrate 50 into abutment against the abrasive cloth 46. In FIG. 2, a water supply nozzle 54 and a dresser 56 are also illustrated.

The pressing pressure of the carrier head 52 may be selected within the range of from 10 hPa to 1,000 hPa, and is preferably from 30 hPa to 500 hPa. In addition, the rotation speed of each of the turntable 48 and the carrier head 52 may be appropriately selected within the range of from 10 rpm to 400 rpm, and is preferably from 30 rpm to 150 rpm. The flow rate of the slurry (chemical mechanical polishing composition) 44 to be supplied from the slurry supply nozzle 42 may be selected within the range of from 10 mL/min to 1,000 mL/min, and is preferably from 50 mL/min to 400 mL/min.

Examples of the commercially available polishing apparatus include models "EPO-112" and "EPO-222" manufactured by Ebara Corporation, models "LGP-510" and "LGP-552" manufactured by Lapmaster SFT Corporation, and models "Mirra" and "Reflexion" manufactured by Applied Materials Inc.

2.3. Cleaning Step

Subsequently, the resultant surface to be treated is cleaned using the above-mentioned cleaning composition. According to the cleaning method according to this embodiment, on the surface to be treated after the completion of CMP, where a wiring material and the tungsten film coexist with the insulating film, such as the silicon oxide film, the corrosion of the wiring material and the tungsten film can be suppressed, and at the same time, an oxide film and an organic residue on the wiring board can be efficiently removed.

A cleaning method is not particularly limited, but the cleaning step is performed by a method involving bringing the above-mentioned cleaning composition into direct contact with the surface to be treated. Examples of the method of bringing the cleaning composition into direct contact with the surface to be treated include: a dipping method involving filling a cleaning bath with the cleaning composition and dipping the wiring board thereinto; a spin method involving rotating the wiring board at high speed while causing the cleaning composition to flow down to the wiring board from a nozzle; and a spray method involving spraying the cleaning composition to the wiring board to clean the wiring board. In addition, as a device for performing such method, for example, there are given: a batch cleaning device to simultaneously clean a plurality of wiring boards accommodated in a cassette; and a single-wafer cleaning device to clean one wiring board attached to a holder. In addition, there is also given a platen cleaning system involving spreading, after CMP treatment, the cleaning composition onto another platen of the polishing apparatus, and subjecting the semiconductor substrate to cleaning treatment on the platen.

In the cleaning method according to this embodiment, the temperature of the cleaning composition is generally set to room temperature. However, the cleaning composition may be warmed within a range not impairing its performance. For example, the cleaning composition may be warmed to from about 40° C. to about 70° C.

Further, cleaning with ultrapure water or pure water may be performed before and/or after cleaning by the cleaning method according to this embodiment.

3. EXAMPLES

The invention is described by way of Examples, but the invention is by no means limited to these Examples. The terms "part(s)" and "%" in Examples and Comparative Examples are by mass, unless otherwise stated.

3.1. Chemical Mechanical Polishing Composition Containing Anionic Surfactant or Polyacrylic Acid as (B)

3.1.1. Preparation of Chemical Mechanical Polishing Composition

Comparative Example 101

A colloidal silica aqueous dispersion PL-3 (manufactured by Fuso Chemical Co., Ltd.) was loaded in an amount corresponding to 1 mass % in terms of silica into a container made of polyethylene, and ion-exchanged water and maleic acid serving as a pH adjusting agent were added so as to achieve a total amount of constituent components of 100 mass % and adjust pH to 3. Further, 35 mass % aqueous hydrogen peroxide was added as an oxidizing agent at 1 mass % in terms of hydrogen peroxide, and the mixture was stirred for 15 minutes to provide a chemical mechanical polishing composition of Comparative Example 101.

Comparative Examples 102 to 119

On the basis of Comparative Example 101, in accordance with compositions shown in Table 1, chemical mechanical polishing compositions each containing only the component (A) were defined as Comparative Examples 102 to 109, and chemical mechanical polishing compositions each containing only the component (B) were defined as Comparative Examples 110 to 119.

Examples 101 to 118

On the basis of Comparative Example 101, chemical mechanical polishing compositions each containing the component (A) and the component (B) shown in Table 2 were prepared and defined as Examples 101 to 118.

Comparative Examples 120 to 125

On the basis of Comparative Example 101, chemical mechanical polishing compositions each containing the component (A) and the component (B) shown in Table 2 were prepared and defined as Comparative Examples 120 to 125.

Examples 119 to 132

Next, on the basis of Example 108, various chemical mechanical polishing compositions were prepared by changing the addition amounts of the component (A) and the component (B), the amount of hydrogen peroxide serving as the oxidizing agent, the kind of the pH adjusting agent, and the pH value. That is, various chemical mechanical polishing compositions were prepared by using N-(2-aminoethyl) piperazine as the component (A) and octyl phosphoric acid ester as the component (B), and changing the addition amounts of the component (A) and the component (B), the amount of hydrogen peroxide serving as the oxidizing agent, the kind of the pH adjusting agent, and the pH value in accordance with compositions shown in Table 3, and were defined as Examples 119 to 132.

Comparative Examples 126 to 153

In accordance with compositions shown in Table 3, chemical mechanical polishing compositions using no component (B) in Examples 119 to 132 were obtained as Comparative Examples 126 to 139, and chemical mechanical polishing compositions using no component (A) in Examples 119 to 132 were obtained as Comparative Examples 140 to 153.

3.1.2. Evaluation Methods 3.1.2.1. Evaluation of Charge Transfer Resistance A potentio/galvanostat (manufactured by Solartron Analytical, SI 1287) with a frequency response analyzer (manufactured by Solartron Analytical, Model 1252A FRA) connected thereto was used as a measurement apparatus, and an AC voltage having an amplitude of 5 mV and a frequency of from 1,500 Hz to 0.5 Hz changing from a higher frequency to a lower frequency was applied to a metal wafer having one end immersed in an aqueous solution to obtain a resistance value. More specifically, an insulating tape was bonded to a central 1 cm×1 cm portion of a tungsten cut wafer cut to 1 cm×3 cm, an electrode clip was attached to an upper 1 cm×1 cm exposed area of the wafer, the wafer was connected to a measurement apparatus with a controlled AC voltage, and a lower 1 cm×1 cm exposed area of the wafer was immersed in each obtained treatment composition for chemical mechanical polishing at 25° C. After a lapse of 5 minutes of immersion, an AC voltage having an amplitude of 5 mV and a frequency of from 1,500 Hz to 0.5 Hz changing from a higher frequency to a lower frequency was applied to obtain values for the real part and the imaginary part of a resistance value. A semicircular plot obtained by plotting the imaginary part on a vertical axis and the real part on a horizontal axis was analyzed with AC impedance analysis software "ZView" manufactured by Solartron Analytical, and a charge transfer resistance ($\Omega/cm^2$) was calculated. The reciprocal of the resultant charge transfer resistance is a value proportional to the corrosion rate of tungsten.

3.1.2.2. Evaluation of Corrosion Observation

Each obtained chemical mechanical polishing composition was kept at 25° C. A tungsten cut wafer (1 cm×1 cm) was immersed therein for 1 hour, cleaned with running water for 10 seconds, and dried. After that, corrosion of the surface of the wafer was observed with a scanning electron microscope at a magnification of 50,000.

Evaluation criteria for the corrosion are as described below.

Very Good: A case in which no change in shape of the surface due to corrosion is found as compared to that before the immersion is determined as a particularly satisfactory result.

Good: A case in which a site corroded as compared to that before the immersion and a non-corroded site are mixed is determined as a satisfactory result.

Bad: A case in which the entire surface is corroded as compared to that before the immersion is determined as a poor result.

3.1.2.3. Evaluation of Polishing Rate

For a tungsten wafer test piece cut to 3 cm×3 cm serving as an object to be polished, a film thickness was measured in advance using a metal film thickness meter "RG-5" manufactured by NPS, Inc. Model "LM-15C" manufactured by Lapmaster SFT Corporation was used as a polishing apparatus, and "IC1000/K-Groove" manufactured by Rodel Nitta Company was used as a polishing pad. The tungsten wafer test piece was subjected to chemical mechanical polishing treatment for 1 minute under the polishing conditions of a platen rotation speed of 90 rpm, a head rotation speed of 90 rpm, a head pressing pressure of 3 psi, and a chemical mechanical polishing composition supply rate of 100 mL/min. For the test piece after the polishing, a film thickness was similarly measured, and a difference between the film thicknesses before and after the polishing, i.e., a decrease in film thickness due to the chemical mechanical polishing treatment was calculated. A polishing rate was calculated from the decrease in film thickness and the polishing time.

3.1.3. Evaluation Results

The compositions of the chemical mechanical polishing compositions obtained in Comparative Examples 101 to 119, and their evaluation results are shown in Table 1 below. The compositions of the chemical mechanical polishing compositions obtained in Examples 101 to 118 and Comparative Examples 120 to 125, and their evaluation results are shown in Table 2 below. The compositions of the chemical mechanical polishing compositions obtained in Examples 119 to 132 and Comparative Examples 126 to 153, and their evaluation results are shown in Table 3 below.

TABLE 1

| | | Compositions | | | | | |
|---|---|---|---|---|---|---|---|
| | | Component (A) | Addition amount (mass %) | Component (B) | Addition amount (mass %) | Abrasive grains | Addition amount (mass %) |
| Comparative Example | 101 | — | — | — | — | Colloidal silica | 1 |
| | 102 | Piperazine | 0.005 | — | — | Colloidal silica | 1 |
| | 103 | Piperazine | 0.01 | — | — | Colloidal silica | 1 |
| | 104 | N-(2-Aminoethyl)piperazine | 0.005 | — | — | Colloidal silica | 1 |
| | 105 | N-(2-Aminoethyl)piperazine | 0.01 | — | — | Colloidal silica | 1 |
| | 106 | N-(2-Aminoethyl)piperazine | 0.1 | — | — | Colloidal silica | 1 |
| | 107 | N,N'-Bis(3-propylamino)piperazine | 0.005 | — | — | Colloidal silica | 1 |
| | 108 | N,N'-Bis(3-propylamino)piperazine | 0.01 | — | — | Colloidal silica | 1 |
| | 109 | N,N'-Bis(3-propylamino)piperazine | 0.1 | — | — | Colloidal silica | 1 |
| | 110 | — | — | Dipotassium alkenylsuccinate | 0.01 | Colloidal silica | 1 |
| | 111 | — | — | Dipotassium alkenylsuccinate | 0.05 | Colloidal silica | 1 |
| | 112 | — | — | Lauryldimethylaminoacetic acid betaine | 0.001 | Colloidal silica | 1 |
| | 113 | — | — | Potassium dodecylbenzenesulfonate | 0.01 | Colloidal silica | 1 |
| | 114 | — | — | Potassium dodecylbenzenesulfonate | 0.05 | Colloidal silica | 1 |
| | 115 | — | — | Octyl phosphoric acid ester | 0.01 | Colloidal silica | 1 |
| | 116 | — | — | Octyl phosphoric acid ester | 0.05 | Colloidal silica | 1 |
| | 117 | — | — | 2,4,7,9-Tetramethyl-5-decyne-4,7-oligoethylene glycol | 0.01 | Colloidal silica | 1 |
| | 118 | — | — | Polyacrylic acid (JURYMER AC-10L) | 0.01 | Colloidal silica | 1 |
| | 119 | — | — | Polyacrylic acid (JURYMER AC-10H) | 0.05 | Colloidal silica | 1 |

| | | Compositions | | | | Evaluation result | | |
|---|---|---|---|---|---|---|---|---|
| | | Oxidizing agent | Addition amount (mass %) | pH adjusting agent | pH | Charge transfer resistance (kΩ/cm$^2$) | Corrosion observation result | Polishing rate (Å/min) |
| Comparative Example | 101 | Hydrogen peroxide | 1 | Maleic acid | 3 | 1 | Bad | 371 |
| | 102 | Hydrogen peroxide | 1 | Maleic acid | 3 | 1 | Bad | 333 |
| | 103 | Hydrogen peroxide | 1 | Maleic acid | 3 | 1 | Bad | 340 |
| | 104 | Hydrogen peroxide | 1 | Maleic acid | 3 | 6 | Bad | 342 |
| | 105 | Hydrogen peroxide | 1 | Maleic acid | 3 | 13 | Bad | 285 |
| | 106 | Hydrogen peroxide | 1 | Maleic acid | 3 | 51 | Good | 298 |
| | 107 | Hydrogen peroxide | 1 | Maleic acid | 3 | 20 | Bad | 295 |
| | 108 | Hydrogen peroxide | 1 | Maleic acid | 3 | 47 | Good | 216 |
| | 109 | Hydrogen peroxide | 1 | Maleic acid | 3 | 88 | Good | 197 |
| | 110 | Hydrogen peroxide | 1 | Maleic acid | 3 | 1 | Bad | 329 |
| | 111 | Hydrogen peroxide | 1 | Maleic acid | 3 | 1 | Bad | 380 |
| | 112 | Hydrogen peroxide | 1 | Maleic acid | 3 | 23 | Good | 284 |
| | 113 | Hydrogen peroxide | 1 | Maleic acid | 3 | 1 | Bad | 303 |
| | 114 | Hydrogen peroxide | 1 | Maleic acid | 3 | 1 | Bad | 389 |
| | 115 | Hydrogen peroxide | 1 | Maleic acid | 3 | 1 | Bad | 323 |
| | 116 | Hydrogen peroxide | 1 | Maleic acid | 3 | 1 | Bad | 324 |
| | 117 | Hydrogen peroxide | 1 | Maleic acid | 3 | 1 | Bad | 311 |
| | 118 | Hydrogen peroxide | 1 | Maleic acid | 3 | 1 | Bad | 312 |
| | 119 | Hydrogen peroxide | 1 | Maleic acid | 3 | 1 | Bad | 376 |

TABLE 2

| | | Compositions | | | | | |
|---|---|---|---|---|---|---|---|
| | | Component (A) | Addition amount (mass %) | Component (B) | Addition amount (mass %) | Abrasive grains | Addition amount (mass %) |
| Example | 101 | Piperazine | 0.005 | Potassium dodecylbenzenesulfonate | 0.05 | Colloidal silica | 1 |
| | 102 | Piperazine | 0.01 | Potassium dodecylbenzenesulfonate | 0.01 | Colloidal silica | 1 |
| | 103 | N-(2-Aminoethyl)piperazine | 0.005 | Dipotassium alkenylsuccinate | 0.05 | Colloidal silica | 1 |
| | 104 | N-(2-Aminoethyl)piperazine | 0.01 | Dipotassium alkenylsuccinate | 0.01 | Colloidal silica | 1 |
| | 105 | N-(2-Aminoethyl)piperazine | 0.005 | Potassium dodecylbenzenesulfonate | 0.05 | Colloidal silica | 1 |
| | 106 | N-(2-Aminoethyl)piperazine | 0.01 | Potassium dodecylbenzenesulfonate | 0.01 | Colloidal silica | 1 |
| | 107 | N-(2-Aminoethyl)piperazine | 0.005 | Octyl phosphoric acid ester | 0.05 | Colloidal silica | 1 |
| | 108 | N-(2-Aminoethyl)piperazine | 0.01 | Octyl phosphoric acid ester | 0.01 | Colloidal silica | 1 |
| | 109 | N-(2-Aminoethyl)piperazine | 0.01 | Polyacrylic acid (JURYMER AC-10L) | 0.01 | Colloidal silica | 1 |
| | 110 | N-(2-Aminoethyl)piperazine | 0.1 | Polyacrylic acid (JURYMER AC-10H) | 0.05 | Colloidal silica | 1 |
| | 111 | N,N'-Bis(3-propylamino)piperazine | 0.005 | Dipotassium alkenylsuccinate | 0.05 | Colloidal silica | 1 |
| | 112 | N,N'-Bis(3-propylamino)piperazine | 0.01 | Dipotassium alkenylsuccinate | 0.01 | Colloidal silica | 1 |
| | 113 | N,N'-Bis(3-propylamino)piperazine | 0.005 | Potassium dodecylbenzenesulfonate | 0.05 | Colloidal silica | 1 |
| | 114 | N,N'-Bis(3-propylamino)piperazine | 0.01 | Potassium dodecylbenzenesulfonate | 0.01 | Colloidal silica | 1 |
| | 115 | N,N'-Bis(3-propylamino)piperazine | 0.005 | Octyl phosphoric acid ester | 0.05 | Colloidal silica | 1 |
| | 116 | N,N'-Bis(3-propylamino)piperazine | 0.01 | Octyl phosphoric acid ester | 0.01 | Colloidal silica | 1 |
| | 117 | N,N'-Bis(3-propylamino)piperazine | 0.01 | Polyacrylic acid (JURYMER AC-10L) | 0.01 | Colloidal silica | 1 |
| | 118 | N,N'-Bis(3-propylamino)piperazine | 0.1 | Polyacrylic acid (JURYMER AC-10H) | 0.05 | Colloidal silica | 1 |
| Comparative Example | 120 | Piperazine | 0.01 | Lauryldimethylaminoacetic acid betaine | 0.001 | Colloidal silica | 1 |
| | 121 | Piperazine | 0.01 | 2,4,7,9-Tetramethyl-5-decyne-4,7-oligoethylene glycol | 0.01 | Colloidal silica | 1 |
| | 122 | N-(2-Aminoethyl)piperazine | 0.01 | Lauryldimethylaminoacetic acid betaine | 0.001 | Colloidal silica | 1 |
| | 123 | N-(2-Aminoethyl)piperazine | 0.01 | 2,4,7,9-Tetramethyl-5-decyne-4,7-oligoethylene glycol | 0.01 | Colloidal silica | 1 |
| | 124 | N,N'-Bis(3-propylamino)piperazine | 0.01 | Lauryldimethylaminoacetic acid betaine | 0.001 | Colloidal silica | 1 |
| | 125 | N,N'-Bis(3-propylamino)piperazine | 0.01 | 2,4,7,9-Tetramethyl-5-decyne-4,7-oligoethylene glycol | 0.01 | Colloidal silica | 1 |

| | | Compositions | | | | Evaluation result | | | |
|---|---|---|---|---|---|---|---|---|---|
| | | Oxidizing agent | Addition amount (mass %) | pH adjusting agent | pH | Charge transfer resistance (kΩ/cm$^2$) | Corrosion observation result | Polishing rate (Å/min) | RC/(RA + RB) value |
| Example | 101 | Hydrogen peroxide | 1 | Maleic acid | 3 | 100 | Very Good | 305 | 50 |
| | 102 | Hydrogen peroxide | 1 | Maleic acid | 3 | 120 | Very Good | 298 | 60 |
| | 103 | Hydrogen peroxide | 1 | Maleic acid | 3 | 325 | Very Good | 321 | 46 |
| | 104 | Hydrogen peroxide | 1 | Maleic acid | 3 | 340 | Very Good | 186 | 24 |
| | 105 | Hydrogen peroxide | 1 | Maleic acid | 3 | 230 | Very Good | 286 | 33 |
| | 106 | Hydrogen peroxide | 1 | Maleic acid | 3 | 285 | Very Good | 196 | 20 |
| | 107 | Hydrogen peroxide | 1 | Maleic acid | 3 | 385 | Very Good | 277 | 55 |
| | 108 | Hydrogen peroxide | 1 | Maleic acid | 3 | 480 | Very Good | 231 | 34 |
| | 109 | Hydrogen peroxide | 1 | Maleic acid | 3 | 100 | Very Good | 205 | 7 |
| | 110 | Hydrogen peroxide | 1 | Maleic acid | 3 | 405 | Very Good | 180 | 8 |
| | 111 | Hydrogen peroxide | 1 | Maleic acid | 3 | 105 | Very Good | 240 | 5 |
| | 112 | Hydrogen peroxide | 1 | Maleic acid | 3 | 115 | Very Good | 287 | 2 |
| | 113 | Hydrogen peroxide | 1 | Maleic acid | 3 | 340 | Very Good | 211 | 16 |
| | 114 | Hydrogen peroxide | 1 | Maleic acid | 3 | 420 | Very Good | 280 | 9 |
| | 115 | Hydrogen peroxide | 1 | Maleic acid | 3 | 280 | Very Good | 257 | 13 |
| | 116 | Hydrogen peroxide | 1 | Maleic acid | 3 | 325 | Very Good | 199 | 7 |
| | 117 | Hydrogen peroxide | 1 | Maleic acid | 3 | 180 | Very Good | 242 | 4 |
| | 118 | Hydrogen peroxide | 1 | Maleic acid | 3 | 310 | Very Good | 212 | 3 |
| Comparative Example | 120 | Hydrogen peroxide | 1 | Maleic acid | 3 | 7 | Bad | 273 | 0.3 |
| | 121 | Hydrogen peroxide | 1 | Maleic acid | 3 | 1 | Bad | 301 | 0.5 |
| | 122 | Hydrogen peroxide | 1 | Maleic acid | 3 | 20 | Bad | 286 | 0.6 |
| | 123 | Hydrogen peroxide | 1 | Maleic acid | 3 | 4 | Bad | 289 | 0.3 |
| | 124 | Hydrogen peroxide | 1 | Maleic acid | 3 | 23 | Bad | 301 | 0.3 |
| | 125 | Hydrogen peroxide | 1 | Maleic acid | 3 | 6 | Bad | 222 | 0.1 |

TABLE 3

| | | Compositions | | | | | |
|---|---|---|---|---|---|---|---|
| | | Component (A) | Addition amount (mass %) | Component (B) | Addition amount (mass %) | Abrasive grains | Addition amount (mass %) |
| Comparative Example | 126 | N-(2-Aminoethyl)piperazine | 0.005 | — | — | Colloidal silica | 1 |
| | 127 | N-(2-Aminoethyl)piperazine | 0.005 | — | — | Colloidal silica | 1 |
| | 128 | N-(2-Aminoethyl)piperazine | 0.005 | — | — | Colloidal silica | 1 |
| | 129 | N-(2-Aminoethyl)piperazine | 0.005 | — | — | Colloidal silica | 1 |

TABLE 3-continued

|   |   | | | | | | |
|---|---|---|---|---|---|---|---|
|   | 130 | N-(2-Aminoethyl)piperazine | 0.005 | — | — | Colloidal silica | 1 |
|   | 131 | N-(2-Aminoethyl)piperazine | 0.005 | — | — | Colloidal silica | 1 |
|   | 132 | N-(2-Aminoethyl)piperazine | 0.005 | — | — | Colloidal silica | 1 |
|   | 133 | N-(2-Aminoethyl)piperazine | 0.01 | — | — | Colloidal silica | 1 |
|   | 134 | N-(2-Aminoethyl)piperazine | 0.01 | — | — | Colloidal silica | 1 |
|   | 135 | N-(2-Aminoethyl)piperazine | 0.01 | — | — | Colloidal silica | 1 |
|   | 136 | N-(2-Aminoethyl)piperazine | 0.01 | — | — | Colloidal silica | 1 |
|   | 137 | N-(2-Aminoethyl)piperazine | 0.01 | — | — | Colloidal silica | 1 |
|   | 138 | N-(2-Aminoethyl)piperazine | 0.01 | — | — | Colloidal silica | 1 |
|   | 139 | N-(2-Aminoethyl)piperazine | 0.01 | — | — | Colloidal silica | 1 |
|   | 140 | — | — | Octyl phosphoric acid ester | 0.05 | Colloidal silica | 1 |
|   | 141 | — | — | Octyl phosphoric acid ester | 0.05 | Colloidal silica | 1 |
|   | 142 | — | — | Octyl phosphoric acid ester | 0.05 | Colloidal silica | 1 |
|   | 143 | — | — | Octyl phosphoric acid ester | 0.05 | Colloidal silica | 1 |
|   | 144 | — | — | Octyl phosphoric acid ester | 0.05 | Colloidal silica | 1 |
|   | 145 | — | — | Octyl phosphoric acid ester | 0.05 | Colloidal silica | 1 |
|   | 146 | — | — | Octyl phosphoric acid ester | 0.05 | Colloidal silica | 1 |
|   | 147 | — | — | Octyl phosphoric acid ester | 0.01 | Colloidal silica | 1 |
|   | 148 | — | — | Octyl phosphoric acid ester | 0.01 | Colloidal silica | 1 |
|   | 149 | — | — | Octyl phosphoric acid ester | 0.01 | Colloidal silica | 1 |
|   | 150 | — | — | Octyl phosphoric acid ester | 0.01 | Colloidal silica | 1 |
|   | 151 | — | — | Octyl phosphoric acid ester | 0.01 | Colloidal silica | 1 |
|   | 152 | — | — | Octyl phosphoric acid ester | 0.01 | Colloidal silica | 1 |
|   | 153 | — | — | Octyl phosphoric acid ester | 0.01 | Colloidal silica | 1 |
| Example | 119 | N-(2-Aminoethyl)piperazine | 0.005 | Octyl phosphoric acid ester | 0.05 | Colloidal silica | 1 |
|   | 120 | N-(2-Aminoethyl)piperazine | 0.005 | Octyl phosphoric acid ester | 0.05 | Colloidal silica | 1 |
|   | 121 | N-(2-Aminoethyl)piperazine | 0.005 | Octyl phosphoric acid ester | 0.05 | Colloidal silica | 1 |
|   | 122 | N-(2-Aminoethyl)piperazine | 0.005 | Octyl phosphoric acid ester | 0.05 | Colloidal silica | 1 |
|   | 123 | N-(2-Aminoethyl)piperazine | 0.005 | Octyl phosphoric acid ester | 0.05 | Colloidal silica | 1 |
|   | 124 | N-(2-Aminoethyl)piperazine | 0.005 | Octyl phosphoric acid ester | 0.05 | Colloidal silica | 1 |
|   | 125 | N-(2-Aminoethyl)piperazine | 0.005 | Octyl phosphoric acid ester | 0.05 | Colloidal silica | 1 |
|   | 126 | N-(2-Aminoethyl)piperazine | 0.01 | Octyl phosphoric acid ester | 0.01 | Colloidal silica | 1 |
|   | 127 | N-(2-Aminoethyl)piperazine | 0.01 | Octyl phosphoric acid ester | 0.01 | Colloidal silica | 1 |
|   | 128 | N-(2-Aminoethyl)piperazine | 0.01 | Octyl phosphoric acid ester | 0.01 | Colloidal silica | 1 |
|   | 129 | N-(2-Aminoethyl)piperazine | 0.01 | Octyl phosphoric acid ester | 0.01 | Colloidal silica | 1 |
|   | 130 | N-(2-Aminoethyl)piperazine | 0.01 | Octyl phosphoric acid ester | 0.01 | Colloidal silica | 1 |
|   | 131 | N-(2-Aminoethyl)piperazine | 0.01 | Octyl phosphoric acid ester | 0.01 | Colloidal silica | 1 |
|   | 132 | N-(2-Aminoethyl)piperazine | 0.01 | Octyl phosphoric acid ester | 0.01 | Colloidal silica | 1 |

|   |   | Compositions | | | Evaluation result | | | |
|---|---|---|---|---|---|---|---|---|
|   |   | Oxidizing agent | Addition amount (mass %) | pH adjusting agent | pH | Charge transfer resistance (kΩ/cm$^2$) | Corrosion observation result | Polishing rate (Å/min) | RC/(RA + RB) value |
| Comparative Example | 126 | Hydrogen peroxide | 2 | Maleic acid | 3 | 2 | Bad | 394 | — |
|   | 127 | Hydrogen peroxide | 3 | Maleic acid | 3 | 1 | Bad | 411 | — |
|   | 128 | Hydrogen peroxide | 1 | Maleic acid | 1 | 4 | Bad | 275 | — |
|   | 129 | Hydrogen peroxide | 1 | Maleic acid | 2 | 7 | Bad | 294 | — |
|   | 130 | Hydrogen peroxide | 1 | Maleic acid | 4 | 7 | Bad | 380 | — |
|   | 131 | Hydrogen peroxide | 1 | Nitric acid | 3 | 7 | Bad | 329 | — |
|   | 132 | Hydrogen peroxide | 1 | Phosphoric acid | 3 | 6 | Bad | 316 | — |
|   | 133 | Hydrogen peroxide | 2 | Maleic acid | 3 | 6 | Bad | 355 | — |
|   | 134 | Hydrogen peroxide | 3 | Maleic acid | 3 | 4 | Bad | 365 | — |
|   | 135 | Hydrogen peroxide | 1 | Maleic acid | 1 | 8 | Bad | 220 | — |
|   | 136 | Hydrogen peroxide | 1 | Maleic acid | 2 | 12 | Bad | 285 | — |
|   | 137 | Hydrogen peroxide | 1 | Maleic acid | 4 | 13 | Bad | 343 | — |
|   | 138 | Hydrogen peroxide | 1 | Nitric acid | 3 | 13 | Bad | 330 | — |
|   | 139 | Hydrogen peroxide | 1 | Phosphoric acid | 3 | 12 | Bad | 319 | — |
|   | 140 | Hydrogen peroxide | 2 | Maleic acid | 3 | 1 | Bad | 354 | — |
|   | 141 | Hydrogen peroxide | 3 | Maleic acid | 3 | 1 | Bad | 358 | — |
|   | 142 | Hydrogen peroxide | 1 | Maleic acid | 1 | 1 | Bad | 65 | — |
|   | 143 | Hydrogen peroxide | 1 | Maleic acid | 2 | 1 | Bad | 125 | — |
|   | 144 | Hydrogen peroxide | 1 | Maleic acid | 4 | 1 | Bad | 330 | — |
|   | 145 | Hydrogen peroxide | 1 | Nitric acid | 3 | 1 | Bad | 324 | — |
|   | 146 | Hydrogen peroxide | 1 | Phosphoric acid | 3 | 1 | Bad | 321 | — |
|   | 147 | Hydrogen peroxide | 2 | Maleic acid | 3 | 1 | Bad | 358 | — |
|   | 148 | Hydrogen peroxide | 3 | Maleic acid | 3 | 1 | Bad | 360 | — |
|   | 149 | Hydrogen peroxide | 1 | Maleic acid | 1 | 1 | Bad | 145 | — |
|   | 150 | Hydrogen peroxide | 1 | Maleic acid | 2 | 1 | Bad | 220 | — |
|   | 151 | Hydrogen peroxide | 1 | Maleic acid | 4 | 1 | Bad | 319 | — |
|   | 152 | Hydrogen peroxide | 1 | Nitric acid | 3 | 1 | Bad | 352 | — |
|   | 153 | Hydrogen peroxide | 1 | Phosphoric acid | 3 | 1 | Bad | 344 | — |
| Example | 119 | Hydrogen peroxide | 2 | Maleic acid | 3 | 230 | Very Good | 321 | 77 |
|   | 120 | Hydrogen peroxide | 3 | Maleic acid | 3 | 135 | Very Good | 348 | 68 |
|   | 121 | Hydrogen peroxide | 1 | Maleic acid | 1 | 255 | Very Good | 78 | 51 |
|   | 122 | Hydrogen peroxide | 1 | Maleic acid | 2 | 310 | Very Good | 115 | 39 |
|   | 123 | Hydrogen peroxide | 1 | Maleic acid | 4 | 320 | Very Good | 300 | 40 |
|   | 124 | Hydrogen peroxide | 1 | Nitric acid | 3 | 320 | Very Good | 318 | 40 |

TABLE 3-continued

| 125 | Hydrogen peroxide | 1 | Phosphoric acid | 3 | 335 | Very Good | 322 | 48 |
| 126 | Hydrogen peroxide | 2 | Maleic acid | 3 | 350 | Very Good | 380 | 50 |
| 127 | Hydrogen peroxide | 3 | Maleic acid | 3 | 240 | Very Good | 355 | 48 |
| 128 | Hydrogen peroxide | 1 | Maleic acid | 1 | 320 | Very Good | 138 | 36 |
| 129 | Hydrogen peroxide | 1 | Maleic acid | 2 | 400 | Very Good | 212 | 31 |
| 130 | Hydrogen peroxide | 1 | Maleic acid | 4 | 400 | Very Good | 302 | 29 |
| 131 | Hydrogen peroxide | 1 | Nitric acid | 3 | 400 | Very Good | 351 | 29 |
| 132 | Hydrogen peroxide | 1 | Phosphoric acid | 3 | 400 | Very Good | 334 | 35 |

Additional information is given on the following components in Tables 1 and 2, and Tables 4, 5, and 10 to 12 below.

Polyacrylic acid (manufactured by Toagosei Co., Ltd., product name: "JURYMER AC-10L", Mw=55,000)

Polyacrylic acid (manufactured by Toagosei Co., Ltd., product name: "JURYMER AC-IOH", Mw=700,000)

As apparent from Comparative Examples 102 to 119 and 126 to 153, none of the chemical mechanical polishing compositions each prepared using the component (A) or the component (B) alone achieved satisfactory corrosion suppression. In addition, also in each of Comparative Examples 120 to 125, satisfactory corrosion suppression was not achieved. This is presumably because the relational expression RC/(RA+RB) of the charge transfer resistances is 1 or less, and hence a synergy effect does not act between the component (A) and the component (B).

In contrast, as apparent from Table 2, in each of Examples 101 to 118, satisfactory corrosion suppression was achieved. This is presumably because in each of Examples 101 to 118, the relational expression RC/(RA+RB) of the charge transfer resistances is more than 1, and a synergy effect acts between the component (A) and the component (B).

In addition, as apparent from Table 3, in each of Examples 119 to 132, satisfactory corrosion suppression was achieved. This is presumably because when the relational expression RC/(RA+RB) of the charge transfer resistances is more than 1, a synergy effect acts between the component (A) and the component (B) irrespective of the addition amounts of additives, the addition amount of the oxidizing agent, the kind of the pH adjusting agent, and the pH value. Thus, it has been demonstrated that when the relational expression RC/(RA+RB) of the charge transfer resistances is more than 1, a satisfactory tungsten corrosion suppression ability is expressed irrespective of the addition amounts of additives, the addition amount of the oxidizing agent, the kind of the pH adjusting agent, and the pH value.

3.2. Chemical Mechanical Polishing Composition Containing Surfactant Having Sulfo Group as (B)

3.2.1. Preparation of Chemical Mechanical Polishing Composition

Comparative Example 201

A colloidal silica aqueous dispersion PL-3 (manufactured by Fuso Chemical Co., Ltd.) was loaded in an amount corresponding to 1 mass % in terms of silica into a container made of polyethylene, and ion-exchanged water and maleic acid serving as a pH adjusting agent were added so as to achieve a total amount of constituent components of 100 mass % and adjust pH to 3. Further, 35 mass % aqueous hydrogen peroxide was added as an oxidizing agent at 1 mass % in terms of hydrogen peroxide, and the mixture was stirred for 15 minutes to provide a chemical mechanical polishing composition of Comparative Example 201.

Comparative Examples 202 to 214

On the basis of Comparative Example 201, in accordance with compositions shown in Table 4, chemical mechanical polishing compositions each containing only the component (A) were defined as Comparative Examples 202 to 208, and chemical mechanical polishing compositions each containing only the component (B) were defined as Comparative Examples 209 to 214.

Examples 201 to 212

On the basis of Comparative Example 201, chemical mechanical polishing compositions each containing the component (A) and the component (B) shown in Table 5 were prepared and defined as Examples 201 to 212.

Comparative Examples 215 to 221

On the basis of Comparative Example 201, chemical mechanical polishing compositions each containing the component (A) and the component (B) shown in Table 5 were prepared and defined as Comparative Examples 215 to 221.

Examples 213 to 226

Next, on the basis of Example 201, various chemical mechanical polishing compositions were prepared by changing the addition amounts of the component (A) and the component (B), the amount of hydrogen peroxide serving as the oxidizing agent, the kind of the pH adjusting agent, and the pH value. That is, various chemical mechanical polishing compositions were prepared by using histidine as the component (A) and potassium dodecylbenzenesulfonate as the component (B), and changing the addition amounts of the component (A) and the component (B), the amount of hydrogen peroxide serving as the oxidizing agent, the kind of the pH adjusting agent, and the pH value in accordance with compositions shown in Table 6, and were defined as Examples 213 to 226.

Comparative Examples 222 to 249

In accordance with compositions shown in Table 6, chemical mechanical polishing compositions using no component (B) in Examples 213 to 226 were obtained as Comparative Examples 222 to 235, and chemical mechanical polishing compositions using no component (A) in Examples 213 to 226 were obtained as Comparative Examples 236 to 249.

3.2.2. Evaluation Methods

Evaluations were performed in the same manner as in the section "3.1.2. Evaluation Methods" above.

3.2.3. Evaluation Results

The compositions of the chemical mechanical polishing compositions obtained in Comparative Examples 201 to 214, and their evaluation results are shown in Table 4 below. The compositions of the chemical mechanical polishing compositions obtained in Examples 201 to 212 and Comparative Examples 215 to 221, and their evaluation results are shown in Table 5 below. The compositions of the chemical mechanical polishing compositions obtained in Examples 213 to 226 and Comparative Examples 222 to 249, and their evaluation results are shown in Table 6 below.

TABLE 4

| | | | | Compositions | | | |
|---|---|---|---|---|---|---|---|
| | | Component (A) | Addition amount (mass %) | Component (B) | Addition amount (mass %) | Abrasive grains | Addition amount (mass %) |
| Comparative Example | 201 | — | — | — | — | Colloidal silica | 1 |
| | 202 | Histidine | 0.005 | — | — | Colloidal silica | 1 |
| | 203 | Histidine | 0.01 | — | — | Colloidal silica | 1 |
| | 204 | Histidine | 0.05 | — | — | Colloidal silica | 1 |
| | 205 | Arginine | 0.005 | — | — | Colloidal silica | 1 |
| | 206 | Arginine | 0.01 | — | — | Colloidal silica | 1 |
| | 207 | Arginine | 0.05 | — | — | Colloidal silica | 1 |
| | 208 | Aspartic acid | 0.01 | — | — | Colloidal silica | 1 |
| | 209 | — | — | Potassium dodecylbenzenesulfonate | 0.01 | Colloidal silica | 1 |
| | 210 | — | — | Potassium dodecylbenzenesulfonate | 0.05 | Colloidal silica | 1 |
| | 211 | — | — | Dodecanesulfonic acid | 0.01 | Colloidal silica | 1 |
| | 212 | — | — | Dodecanesulfonic acid | 0.05 | Colloidal silica | 1 |
| | 213 | — | — | Octyl phosphoric acid ester | 0.01 | Colloidal silica | 1 |
| | 214 | — | — | Polyacrylic acid (JURYMER AC-10L) | 0.01 | Colloidal silica | 1 |

| | | Compositions | | | | Evaluation result | | | |
|---|---|---|---|---|---|---|---|---|---|
| | | Oxidizing agent | Addition amount (mass %) | pH adjusting agent | pH | Charge transfer resistance (kΩ/cm$^2$) | Corrosion observation result | Polishing rate (Å/min) | RC/(RA + RB) value |
| Comparative Example | 201 | Hydrogen peroxide | 1 | Maleic acid | 3 | 1 | Bad | 371 | — |
| | 202 | Hydrogen peroxide | 1 | Maleic acid | 3 | 24 | Good | 320 | — |
| | 203 | Hydrogen peroxide | 1 | Maleic acid | 3 | 56 | Good | 354 | — |
| | 204 | Hydrogen peroxide | 1 | Maleic acid | 3 | 93 | Good | 318 | — |
| | 205 | Hydrogen peroxide | 1 | Maleic acid | 3 | 29 | Good | 317 | — |
| | 206 | Hydrogen peroxide | 1 | Maleic acid | 3 | 56 | Good | 275 | — |
| | 207 | Hydrogen peroxide | 1 | Maleic acid | 3 | 98 | Good | 335 | — |
| | 208 | Hydrogen peroxide | 1 | Maleic acid | 3 | 1 | Bad | 305 | — |
| | 209 | Hydrogen peroxide | 1 | Maleic acid | 3 | 1 | Bad | 303 | — |
| | 210 | Hydrogen peroxide | 1 | Maleic acid | 3 | 1 | Bad | 348 | — |
| | 211 | Hydrogen peroxide | 1 | Maleic acid | 3 | 1 | Bad | 303 | — |
| | 212 | Hydrogen peroxide | 1 | Maleic acid | 3 | 1 | Bad | 351 | — |
| | 213 | Hydrogen peroxide | 1 | Maleic acid | 3 | 1 | Bad | 349 | — |
| | 214 | Hydrogen peroxide | 1 | Maleic acid | 3 | 1 | Bad | 383 | — |

TABLE 5

| | | | | Compositions | | | |
|---|---|---|---|---|---|---|---|
| | | Component (A) | Addition amount (mass %) | Component (B) | Addition amount (mass %) | Abrasive grains | Addition amount (mass %) |
| Example | 201 | Histidine | 0.005 | Potassium dodecylbenzenesulfonate | 0.05 | Colloidal silica | 1 |
| | 202 | Histidine | 0.01 | Potassium dodecylbenzenesulfonate | 0.01 | Colloidal silica | 1 |
| | 203 | Histidine | 0.05 | Potassium dodecylbenzenesulfonate | 0.05 | Colloidal silica | 1 |
| | 204 | Arginine | 0.01 | Potassium dodecylbenzenesulfonate | 0.01 | Colloidal silica | 1 |
| | 205 | Histidine | 0.005 | Dodecanesulfonic acid | 0.05 | Colloidal silica | 1 |
| | 206 | Histidine | 0.01 | Dodecanesulfonic acid | 0.01 | Colloidal silica | 1 |
| | 207 | Histidine | 0.05 | Dodecanesulfonic acid | 0.05 | Colloidal silica | 1 |
| | 208 | Arginine | 0.005 | Potassium dodecylbenzenesulfonate | 0.05 | Colloidal silica | 1 |
| | 209 | Arginine | 0.005 | Dodecanesulfonic acid | 0.05 | Colloidal silica | 1 |
| | 210 | Arginine | 0.01 | Dodecanesulfonic acid | 0.01 | Colloidal silica | 1 |
| | 211 | Arginine | 0.05 | Potassium dodecylbenzenesulfonate | 0.05 | Colloidal silica | 1 |
| | 212 | Arginine | 0.05 | Dodecanesulfonic acid | 0.05 | Colloidal silica | 1 |
| Comparative Example | 215 | Histidine | 0.01 | Octyl phosphoric acid ester | 0.01 | Colloidal silica | 1 |
| | 216 | Histidine | 0.01 | Polyacrylic acid (JURYMER AC-10L) | 0.01 | Colloidal silica | 1 |

TABLE 5-continued

| | | | | | | | | |
|---|---|---|---|---|---|---|---|---|
| | 217 | Arginine | 0.01 | Octyl phosphoric acid ester | 0.01 | Colloidal silica | | 1 |
| | 218 | Arginine | 0.01 | Polyacrylic acid (JURYMER AC-10L) | 0.01 | Colloidal silica | | 1 |
| | 219 | Aspartic acid | 0.01 | Potassium dodecylbenzenesulfonate | 0.01 | Colloidal silica | | 1 |
| | 220 | Aspartic acid | 0.01 | Octyl phosphoric acid ester | 0.01 | Colloidal silica | | 1 |
| | 221 | Aspartic acid | 0.01 | Polyacrylic acid (JURYMER AC-10L) | 0.01 | Colloidal silica | | 1 |

| | | Compositions | | | | Evaluation result | | | |
|---|---|---|---|---|---|---|---|---|---|
| | | | | | | Charge | | | |
| | | Oxidizing agent | Addition amount (mass %) | pH adjusting agent | pH | transfer resistance (kΩ/cm$^2$) | Corrosion observation result | Polishing rate (Å/min) | RC/(RA + RB) value |
| Example | 201 | Hydrogen peroxide | 1 | Maleic acid | 3 | 390 | Very Good | 358 | 16 |
| | 202 | Hydrogen peroxide | 1 | Maleic acid | 3 | 240 | Very Good | 342 | 4 |
| | 203 | Hydrogen peroxide | 1 | Maleic acid | 3 | 680 | Very Good | 344 | 7 |
| | 204 | Hydrogen peroxide | 1 | Maleic acid | 3 | 225 | Very Good | 286 | 4 |
| | 205 | Hydrogen peroxide | 1 | Maleic acid | 3 | 295 | Very Good | 349 | 12 |
| | 206 | Hydrogen peroxide | 1 | Maleic acid | 3 | 235 | Very Good | 332 | 4 |
| | 207 | Hydrogen peroxide | 1 | Maleic acid | 3 | 725 | Very Good | 329 | 8 |
| | 208 | Hydrogen peroxide | 1 | Maleic acid | 3 | 380 | Very Good | 318 | 13 |
| | 209 | Hydrogen peroxide | 1 | Maleic acid | 3 | 285 | Very Good | 317 | 10 |
| | 210 | Hydrogen peroxide | 1 | Maleic acid | 3 | 232 | Very Good | 352 | 4 |
| | 211 | Hydrogen peroxide | 1 | Maleic acid | 3 | 700 | Very Good | 298 | 7 |
| | 212 | Hydrogen peroxide | 1 | Maleic acid | 3 | 565 | Very Good | 295 | 6 |
| Comparative Example | 215 | Hydrogen peroxide | 1 | Maleic acid | 3 | 50 | Good | 391 | 0.9 |
| | 216 | Hydrogen peroxide | 1 | Maleic acid | 3 | 51 | Good | 328 | 0.9 |
| | 217 | Hydrogen peroxide | 1 | Maleic acid | 3 | 46 | Good | 318 | 0.8 |
| | 218 | Hydrogen peroxide | 1 | Maleic acid | 3 | 52 | Good | 322 | 0.9 |
| | 219 | Hydrogen peroxide | 1 | Maleic acid | 3 | 1 | Bad | 309 | 0.5 |
| | 220 | Hydrogen peroxide | 1 | Maleic acid | 3 | 1 | Bad | 354 | 0.5 |
| | 221 | Hydrogen peroxide | 1 | Maleic acid | 3 | 1 | Bad | 348 | 0.5 |

TABLE 6

| | | Compositions | | | | | |
|---|---|---|---|---|---|---|---|
| | | Component (A) | Addition amount (mass %) | Component (B) | Addition amount (mass %) | Abrasive grains | Addition amount (mass %) |
| Comparative Example | 222 | Histidine | 0.005 | — | — | Colloidal silica | 1 |
| | 223 | Histidine | 0.005 | — | — | Colloidal silica | 1 |
| | 224 | Histidine | 0.005 | — | — | Colloidal silica | 1 |
| | 225 | Histidine | 0.005 | — | — | Colloidal silica | 1 |
| | 226 | Histidine | 0.005 | — | — | Colloidal silica | 1 |
| | 227 | Histidine | 0.005 | — | — | Colloidal silica | 1 |
| | 228 | Histidine | 0.005 | — | — | Colloidal silica | 1 |
| | 229 | Histidine | 0.01 | — | — | Colloidal silica | 1 |
| | 230 | Histidine | 0.01 | — | — | Colloidal silica | 1 |
| | 231 | Histidine | 0.01 | — | — | Colloidal silica | 1 |
| | 235 | Histidine | 0.01 | — | — | Colloidal silica | 1 |
| | 233 | Histidine | 0.01 | — | — | Colloidal silica | 1 |
| | 234 | Histidine | 0.01 | — | — | Colloidal silica | 1 |
| | 235 | Histidine | 0.01 | — | — | Colloidal silica | 1 |
| | 236 | — | — | Potassium dodecylbenzenesulfonate | 0.005 | Colloidal silica | 1 |
| | 237 | — | — | Potassium dodecylbenzenesulfonate | 0.005 | Colloidal silica | 1 |
| | 238 | — | — | Potassium dodecylbenzenesulfonate | 0.005 | Colloidal silica | 1 |
| | 239 | — | — | Potassium dodecylbenzenesulfonate | 0.005 | Colloidal silica | 1 |
| | 240 | — | — | Potassium dodecylbenzenesulfonate | 0.005 | Colloidal silica | 1 |
| | 241 | — | — | Potassium dodecylbenzenesulfonate | 0.005 | Colloidal silica | 1 |
| | 242 | — | — | Potassium dodecylbenzenesulfonate | 0.005 | Colloidal silica | 1 |
| | 243 | — | — | Potassium dodecylbenzenesulfonate | 0.01 | Colloidal silica | 1 |
| | 244 | — | — | Potassium dodecylbenzenesulfonate | 0.01 | Colloidal silica | 1 |
| | 245 | — | — | Potassium dodecylbenzenesulfonate | 0.01 | Colloidal silica | 1 |
| | 246 | — | — | Potassium dodecylbenzenesulfonate | 0.01 | Colloidal silica | 1 |
| | 247 | — | — | Potassium dodecylbenzenesulfonate | 0.01 | Colloidal silica | 1 |
| | 248 | — | — | Potassium dodecylbenzenesulfonate | 0.01 | Colloidal silica | 1 |
| | 249 | — | — | Potassium dodecylbenzenesulfonate | 0.01 | Colloidal silica | 1 |
| Example | 213 | Histidine | 0.005 | Potassium dodecylbenzenesulfonate | 0.05 | Colloidal silica | 1 |
| | 214 | Histidine | 0.005 | Potassium dodecylbenzenesulfonate | 0.05 | Colloidal silica | 1 |
| | 215 | Histidine | 0.005 | Potassium dodecylbenzenesulfonate | 0.05 | Colloidal silica | 1 |
| | 216 | Histidine | 0.005 | Potassium dodecylbenzenesulfonate | 0.05 | Colloidal silica | 1 |
| | 217 | Histidine | 0.005 | Potassium dodecylbenzenesulfonate | 0.05 | Colloidal silica | 1 |
| | 218 | Histidine | 0.005 | Potassium dodecylbenzenesulfonate | 0.05 | Colloidal silica | 1 |
| | 219 | Histidine | 0.005 | Potassium dodecylbenzenesulfonate | 0.05 | Colloidal silica | 1 |

TABLE 6-continued

|  |  |  |  |  |  |  |  |
|---|---|---|---|---|---|---|---|
|  | 220 | Histidine | 0.01 | Potassium dodecylbenzenesulfonate | 0.01 | Colloidal silica | 1 |
|  | 221 | Histidine | 0.01 | Potassium dodecylbenzenesulfonate | 0.01 | Colloidal silica | 1 |
|  | 222 | Histidine | 0.01 | Potassium dodecylbenzenesulfonate | 0.01 | Colloidal silica | 1 |
|  | 223 | Histidine | 0.01 | Potassium dodecylbenzenesulfonate | 0.01 | Colloidal silica | 1 |
|  | 224 | Histidine | 0.01 | Potassium dodecylbenzenesulfonate | 0.01 | Colloidal silica | 1 |
|  | 225 | Histidine | 0.01 | Potassium dodecylbenzenesulfonate | 0.01 | Colloidal silica | 1 |
|  | 226 | Histidine | 0.01 | Potassium dodecylbenzenesulfonate | 0.01 | Colloidal silica | 1 |

|  |  | Compositions |  |  |  | Evaluation result |  |  |
|---|---|---|---|---|---|---|---|---|
|  |  | Oxidizing agent | Addition amount (mass %) | pH adjusting agent | pH | Charge transfer resistance (kΩ/cm$^2$) | Corrosion observation result | Polishing rate (Å/min) | RC/(RA + RB) value |
| Comparative Example | 222 | Hydrogen peroxide | 2 | Maleic acid | 3 | 20 | Bad | 398 | — |
|  | 223 | Hydrogen peroxide | 3 | Maleic acid | 3 | 15 | Bad | 402 | — |
|  | 224 | Hydrogen peroxide | 1 | Maleic acid | 1 | 14 | Bad | 280 | — |
|  | 225 | Hydrogen peroxide | 1 | Maleic acid | 2 | 30 | Bad | 302 | — |
|  | 226 | Hydrogen peroxide | 1 | Maleic acid | 4 | 35 | Bad | 350 | — |
|  | 227 | Hydrogen peroxide | 1 | Nitric acid | 3 | 41 | Bad | 339 | — |
|  | 228 | Hydrogen peroxide | 1 | Phosphoric acid | 3 | 42 | Bad | 330 | — |
|  | 229 | Hydrogen peroxide | 2 | Maleic acid | 3 | 32 | Bad | 405 | — |
|  | 230 | Hydrogen peroxide | 3 | Maleic acid | 3 | 20 | Bad | 420 | — |
|  | 231 | Hydrogen peroxide | 1 | Maleic acid | 1 | 20 | Bad | 240 | — |
|  | 235 | Hydrogen peroxide | 1 | Maleic acid | 2 | 49 | Bad | 298 | — |
|  | 233 | Hydrogen peroxide | 1 | Maleic acid | 4 | 55 | Bad | 349 | — |
|  | 234 | Hydrogen peroxide | 1 | Nitric acid | 3 | 56 | Bad | 321 | — |
|  | 235 | Hydrogen peroxide | 1 | Phosphoric acid | 3 | 52 | Bad | 332 | — |
|  | 236 | Hydrogen peroxide | 2 | Maleic acid | 3 | 1 | Bad | 421 | — |
|  | 237 | Hydrogen peroxide | 3 | Maleic acid | 3 | 1 | Bad | 444 | — |
|  | 238 | Hydrogen peroxide | 1 | Maleic acid | 1 | 1 | Bad | 180 | — |
|  | 239 | Hydrogen peroxide | 1 | Maleic acid | 2 | 1 | Bad | 298 | — |
|  | 240 | Hydrogen peroxide | 1 | Maleic acid | 4 | 1 | Bad | 285 | — |
|  | 241 | Hydrogen peroxide | 1 | Nitric acid | 3 | 1 | Bad | 329 | — |
|  | 242 | Hydrogen peroxide | 1 | Phosphoric acid | 3 | 1 | Bad | 335 | — |
|  | 243 | Hydrogen peroxide | 2 | Maleic acid | 3 | 1 | Bad | 420 | — |
|  | 244 | Hydrogen peroxide | 3 | Maleic acid | 3 | 1 | Bad | 471 | — |
|  | 245 | Hydrogen peroxide | 1 | Maleic acid | 1 | 1 | Bad | 182 | — |
|  | 246 | Hydrogen peroxide | 1 | Maleic acid | 2 | 1 | Bad | 274 | — |
|  | 247 | Hydrogen peroxide | 1 | Maleic acid | 4 | 1 | Bad | 295 | — |
|  | 248 | Hydrogen peroxide | 1 | Nitric acid | 3 | 1 | Bad | 313 | — |
|  | 249 | Hydrogen peroxide | 1 | Phosphoric acid | 3 | 1 | Bad | 352 | — |
| Example | 213 | Hydrogen peroxide | 2 | Maleic acid | 3 | 110 | Very Good | 328 | 5 |
|  | 214 | Hydrogen peroxide | 3 | Maleic acid | 3 | 105 | Very Good | 368 | 7 |
|  | 215 | Hydrogen peroxide | 1 | Maleic acid | 1 | 140 | Very Good | 230 | 9 |
|  | 216 | Hydrogen peroxide | 1 | Maleic acid | 2 | 185 | Very Good | 290 | 6 |
|  | 217 | Hydrogen peroxide | 1 | Maleic acid | 4 | 180 | Very Good | 402 | 5 |
|  | 218 | Hydrogen peroxide | 1 | Nitric acid | 3 | 180 | Very Good | 395 | 4 |
|  | 219 | Hydrogen peroxide | 1 | Phosphoric acid | 3 | 190 | Very Good | 341 | 4 |
|  | 220 | Hydrogen peroxide | 2 | Maleic acid | 3 | 160 | Very Good | 394 | 5 |
|  | 221 | Hydrogen peroxide | 3 | Maleic acid | 3 | 120 | Very Good | 424 | 6 |
|  | 222 | Hydrogen peroxide | 1 | Maleic acid | 1 | 180 | Very Good | 195 | 9 |
|  | 223 | Hydrogen peroxide | 1 | Maleic acid | 2 | 220 | Very Good | 254 | 4 |
|  | 224 | Hydrogen peroxide | 1 | Maleic acid | 4 | 240 | Very Good | 392 | 4 |
|  | 225 | Hydrogen peroxide | 1 | Nitric acid | 3 | 235 | Very Good | 376 | 4 |
|  | 226 | Hydrogen peroxide | 1 | Phosphoric acid | 3 | 250 | Very Good | 354 | 5 |

As apparent from Comparative Examples 202 to 214 and 222 to 249, none of the chemical mechanical polishing compositions each prepared using the component (A) or the component (B) alone achieved satisfactory corrosion suppression. This is presumably because the charge transfer resistance value is 100 kΩ/cm$^2$ or less, and hence the oxidation rate is high. In addition, also in each of Comparative Examples 215 to 221, satisfactory corrosion suppression was not achieved. This is presumably because the relational expression RC/(RA+RB) of the charge transfer resistances is 1 or less, and hence a synergy effect does not act between the component (A) and the component (B).

In contrast, in each of Examples 211 and 212, satisfactory corrosion suppression was achieved. This is presumably because in each of Examples 211 and 212, the relational expression RC/(RA+RB) of the charge transfer resistances is more than 1, and a synergy effect acts between the component (A) and the component (B), and hence the charge transfer resistance value becomes more than 100 kΩ/cm$^2$.

In addition, as apparent from Table 6, in each of Examples 213 to 226, satisfactory corrosion suppression was achieved. This is presumably because, irrespective of the addition amounts of additives, the addition amount of the oxidizing agent, the kind of the pH adjusting agent, and the pH value, the relational expression RC/(RA+RB) of the charge transfer resistances is more than 1, and a synergy effect acts between the component (A) and the component (B), and hence the charge transfer resistance value becomes more than 100 kΩ/cm$^2$. Thus, it has been demonstrated that when the relational expression RC/(RA+RB) of the charge transfer resistances is more than 1, a satisfactory tungsten corrosion suppression ability is expressed irrespective of the addition amounts of the additives, the addition amount of the oxidizing agent, the kind of the pH adjusting agent, and the pH value.

3.3. Chemical Mechanical Polishing Composition Containing Betaine-Based Surfactant Having Carboxyl Group as (B)

3.3.1. Preparation of Chemical Mechanical Polishing Composition

Comparative Example 301

A colloidal silica aqueous dispersion PL-3 (manufactured by Fuso Chemical Co., Ltd.) was loaded in an amount corresponding to 1 mass % in terms of silica into a container made of polyethylene, and ion-exchanged water and maleic acid serving as a pH adjusting agent were added so as to achieve a total amount of constituent components of 100 mass % and adjust pH to 3. Further, 35 mass % aqueous hydrogen peroxide was added as an oxidizing agent at 1 mass % in terms of hydrogen peroxide, and the mixture was stirred for 15 minutes to provide a chemical mechanical polishing composition of Comparative Example 301.

Comparative Examples 302 to 322

On the basis of Comparative Example 301, in accordance with compositions shown in Table 7, chemical mechanical polishing compositions each containing only the component (A) were defined as Comparative Examples 302 to 311, and chemical mechanical polishing compositions each containing only the component (B) were defined as Comparative Examples 312 to 322.

Examples 301 to 324

On the basis of Comparative Example 301, chemical mechanical polishing compositions each containing the component (A) and the component (B) shown in Table 8 were prepared and defined as Examples 301 to 324.

Comparative Examples 323 to 334

On the basis of Comparative Example 301, chemical mechanical polishing compositions each containing the component (A) and the component (B) shown in Table 8 were prepared and defined as Comparative Examples 323 to 324.

Examples 325 to 338

Next, on the basis of Example 305, various chemical mechanical polishing compositions were prepared by changing the addition amounts of the component (A) and the component (B), the amount of hydrogen peroxide serving as the oxidizing agent, the kind of the pH adjusting agent, and the pH value. That is, various chemical mechanical polishing compositions were prepared by using arginine as the component (A) and lauryldimethylaminoacetic acid betaine as the component (B), and changing the addition amounts of the component (A) and the component (B), the amount of hydrogen peroxide serving as the oxidizing agent, the kind of the pH adjusting agent, and the pH value in accordance with compositions shown in Table 9, and were defined as Examples 325 to 338.

Comparative Examples 335 to 362

In accordance with compositions shown in Table 9, chemical mechanical polishing compositions using no component (B) in Examples 325 to 338 were obtained as Comparative Examples 335 to 348, and chemical mechanical polishing compositions using no component (A) in Examples 325 to 338 were obtained as Comparative Examples 349 to 362.

3.3.2. Evaluation Methods

Evaluations were performed in the same manner as in the section "3.1.2. Evaluation Methods" above.

3.3.3. Evaluation Results

The compositions of the chemical mechanical polishing compositions obtained in Comparative Examples 301 to 322, and their evaluation results are shown in Table 7 below. The compositions of the chemical mechanical polishing compositions obtained in Examples 301 to 324 and Comparative Examples 323 to 334, and their evaluation results are shown in Table 8 below. The compositions of the chemical mechanical polishing compositions obtained in Examples 325 to 338 and Comparative Examples 335 to 362, and their evaluation results are shown in Table 9 below.

TABLE 7

| | | Component (A) | Addition amount (mass %) | Component (B) | Addition amount (mass %) | Abrasive grains | Addition amount (mass %) |
|---|---|---|---|---|---|---|---|
| Comparative Example | 301 | — | — | — | — | Colloidal silica | 1 |
| | 302 | 2-Pyridinemethanol | 0.01 | — | — | Colloidal silica | 1 |
| | 303 | Quinolinic acid | 0.005 | — | — | Colloidal silica | 1 |
| | 304 | Quinolinic acid | 0.01 | — | — | Colloidal silica | 1 |
| | 305 | Quinaldic acid | 0.01 | — | — | Colloidal silica | 1 |
| | 306 | Histidine | 0.005 | — | — | Colloidal silica | 1 |
| | 307 | Histidine | 0.01 | — | — | Colloidal silica | 1 |
| | 308 | Arginine | 0.005 | — | — | Colloidal silica | 1 |
| | 309 | Arginine | 0.01 | — | — | Colloidal silica | 1 |
| | 310 | Aspartic acid | 0.005 | — | — | Colloidal silica | 1 |
| | 311 | Aspartic acid | 0.01 | — | — | Colloidal silica | 1 |
| | 312 | — | — | Lauryldimethylaminoacetic acid betaine | 0.005 | Colloidal silica | 1 |
| | 313 | — | — | Lauryldimethylaminoacetic acid betaine | 0.01 | Colloidal silica | 1 |
| | 314 | — | — | Lauryldimethylaminoacetic acid betaine | 0.1 | Colloidal silica | 1 |

TABLE 7-continued

| | | | | Addition amount (mass %) | | |
|---|---|---|---|---|---|---|
| 315 | — | — | Laurylaminodipropionic acid betaine | 0.005 | Colloidal silica | 1 |
| 316 | — | — | Laurylaminodipropionic acid betaine | 0.01 | Colloidal silica | 1 |
| 317 | — | — | Laurylaminodipropionic acid betaine | 0.1 | Colloidal silica | 1 |
| 318 | — | — | 2-Lauryl-N-carboxymethyl-N-hydroxyethylimidazolinium betaine | 0.005 | Colloidal silica | 1 |
| 319 | — | — | 2-Lauryl-N-carboxymethyl-N-hydroxyethylimidazolinium betaine | 0.01 | Colloidal silica | 1 |
| 320 | — | — | 2-Lauryl-N-carboxymethyl-N-hydroxyethylimidazolinium betaine | 0.1 | Colloidal silica | 1 |
| 321 | — | — | Potassium dodecylbenzenesulfonate | 0.01 | Colloidal silica | 1 |
| 322 | — | — | Octyl phosphoric acid ester | 0.01 | Colloidal silica | 1 |

| | | Compositions | | | Evaluation result | | | |
|---|---|---|---|---|---|---|---|---|
| | | Oxidizing agent | Addition amount (mass %) | pH adjusting agent | pH | Charge transfer resistance (kΩ/cm²) | Corrosion observation result | Polishing rate (Å/min) | RC/(RA + RB) value |
| Comparative Example | 301 | Hydrogen peroxide | 1 | Maleic acid | 3 | 1 | Bad | 371 | — |
| | 302 | Hydrogen peroxide | 1 | Maleic acid | 3 | 5 | Bad | 265 | — |
| | 303 | Hydrogen peroxide | 1 | Maleic acid | 3 | 1 | Bad | 340 | — |
| | 304 | Hydrogen peroxide | 1 | Maleic acid | 3 | 1 | Bad | 365 | — |
| | 305 | Hydrogen peroxide | 1 | Maleic acid | 3 | 1 | Bad | 393 | — |
| | 306 | Hydrogen peroxide | 1 | Maleic acid | 3 | 31 | Bad | 398 | — |
| | 307 | Hydrogen peroxide | 1 | Maleic acid | 3 | 56 | Good | 354 | — |
| | 308 | Hydrogen peroxide | 1 | Maleic acid | 3 | 35 | Bad | 310 | — |
| | 309 | Hydrogen peroxide | 1 | Maleic acid | 3 | 56 | Good | 275 | — |
| | 310 | Hydrogen peroxide | 1 | Maleic acid | 3 | 1 | Bad | 330 | — |
| | 311 | Hydrogen peroxide | 1 | Maleic acid | 3 | 1 | Bad | 305 | — |
| | 312 | Hydrogen peroxide | 1 | Maleic acid | 3 | 35 | Bad | 317 | — |
| | 313 | Hydrogen peroxide | 1 | Maleic acid | 3 | 108 | Very Good | 284 | — |
| | 314 | Hydrogen peroxide | 1 | Maleic acid | 3 | 280 | Very Good | 279 | — |
| | 315 | Hydrogen peroxide | 1 | Maleic acid | 3 | 120 | Very Good | 319 | — |
| | 316 | Hydrogen peroxide | 1 | Maleic acid | 3 | 172 | Very Good | 301 | — |
| | 317 | Hydrogen peroxide | 1 | Maleic acid | 3 | 890 | Very Good | 310 | — |
| | 318 | Hydrogen peroxide | 1 | Maleic acid | 3 | 150 | Very Good | 342 | — |
| | 319 | Hydrogen peroxide | 1 | Maleic acid | 3 | 245 | Very Good | 271 | — |
| | 320 | Hydrogen peroxide | 1 | Maleic acid | 3 | 1000 | Very Good | 289 | — |
| | 321 | Hydrogen peroxide | 1 | Maleic acid | 3 | 1 | Bad | 303 | — |
| | 322 | Hydrogen peroxide | 1 | Maleic acid | 3 | 1 | Bad | 323 | — |

TABLE 8

| | | Compositions | | | | | |
|---|---|---|---|---|---|---|---|
| | | Component (A) | Addition amount (mass %) | Component (B) | Addition amount (mass %) | Abrasive grains | Addition amount (mass %) |
| Example | 301 | Quinolinic acid | 0.005 | Lauryldimethylaminoacetic acid betaine | 0.1 | Colloidal silica | 1 |
| | 302 | Quinolinic acid | 0.01 | Lauryldimethylaminoacetic acid betaine | 0.01 | Colloidal silica | 1 |
| | 303 | Histidine | 0.005 | Lauryldimethylaminoacetic acid betaine | 0.005 | Colloidal silica | 1 |
| | 304 | Histidine | 0.01 | Lauryldimethylaminoacetic acid betaine | 0.01 | Colloidal silica | 1 |
| | 305 | Arginine | 0.005 | Lauryldimethylaminoacetic acid betaine | 0.005 | Colloidal silica | 1 |
| | 306 | Arginine | 0.01 | Lauryldimethylaminoacetic acid betaine | 0.01 | Colloidal silica | 1 |
| | 307 | Aspartic acid | 0.005 | Lauryldimethylaminoacetic acid betaine | 0.005 | Colloidal silica | 1 |
| | 308 | Aspartic acid | 0.01 | Lauryldimethylaminoacetic acid betaine | 0.01 | Colloidal silica | 1 |
| | 309 | Quinolinic acid | 0.005 | Laurylaminodipropionic acid betaine | 0.1 | Colloidal silica | 1 |
| | 310 | Quinolinic acid | 0.01 | Laurylaminodipropionic acid betaine | 0.01 | Colloidal silica | 1 |
| | 311 | Histidine | 0.005 | Laurylaminodipropionic acid betaine | 0.005 | Colloidal silica | 1 |
| | 312 | Histidine | 0.01 | Laurylaminodipropionic acid betaine | 0.01 | Colloidal silica | 1 |
| | 313 | Arginine | 0.005 | Laurylaminodipropionic acid betaine | 0.005 | Colloidal silica | 1 |
| | 314 | Arginine | 0.01 | Laurylaminodipropionic acid betaine | 0.01 | Colloidal silica | 1 |
| | 315 | Aspartic acid | 0.005 | Laurylaminodipropionic acid betaine | 0.005 | Colloidal silica | 1 |
| | 316 | Aspartic acid | 0.01 | Laurylaminodipropionic acid betaine | 0.01 | Colloidal silica | 1 |
| | 317 | Quinolinic acid | 0.005 | 2-Lauryl-N-carboxymethyl-N-hydroxyethylimidazolinium betaine | 0.1 | Colloidal silica | 1 |
| | 318 | Quinolinic acid | 0.01 | 2-Lauryl-N-carboxymethyl-N-hydroxyethylimidazolinium betaine | 0.01 | Colloidal silica | 1 |
| | 319 | Histidine | 0.005 | 2-Lauryl-N-carboxymethyl-N-hydroxyethylimidazolinium betaine | 0.005 | Colloidal silica | 1 |
| | 320 | Histidine | 0.01 | 2-Lauryl-N-carboxymethyl-N-hydroxyethylimidazolinium betaine | 0.01 | Colloidal silica | 1 |
| | 321 | Arginine | 0.005 | 2-Lauryl-N-carboxymethyl-N-hydroxyethylimidazolinium betaine | 0.005 | Colloidal silica | 1 |

TABLE 8-continued

| | | | | | | | |
|---|---|---|---|---|---|---|---|
| | 322 | Arginine | 0.01 | 2-Lauryl-N-carboxymethyl-N-hydroxyethylimidazolinium betaine | 0.01 | Colloidal silica | 1 |
| | 323 | Aspartic acid | 0.005 | 2-Lauryl-N-carboxymethyl-N-hydroxyethylimidazolinium betaine | 0.005 | Colloidal silica | 1 |
| | 324 | Aspartic acid | 0.01 | 2-Lauryl-N-carboxymethyl-N-hydroxyethylimidazolinium betaine | 0.01 | Colloidal silica | 1 |
| Comparative Example | 323 | 2-Pyridinemethanol | 0.01 | Lauryldimethylaminoacetic acid betaine | 0.01 | Colloidal silica | 1 |
| | 324 | 2-Pyridinemethanol | 0.01 | Potassium dodecylbenzenesulfonate | 0.01 | Colloidal silica | 1 |
| | 325 | 2-Pyridinemethanol | 0.01 | Octyl phosphoric acid ester | 0.01 | Colloidal silica | 1 |
| | 326 | Quinolinic acid | 0.01 | Potassium dodecylbenzenesulfonate | 0.01 | Colloidal silica | 1 |
| | 327 | Quinolinic acid | 0.01 | Octyl phosphoric acid ester | 0.01 | Colloidal silica | 1 |
| | 328 | Quinaldic acid | 0.01 | Lauryldimethylaminoacetic acid betaine | 0.01 | Colloidal silica | 1 |
| | 329 | Quinaldic acid | 0.01 | Potassium dodecylbenzenesulfonate | 0.01 | Colloidal silica | 1 |
| | 330 | Quinaldic acid | 0.01 | Octyl phosphoric acid ester | 0.01 | Colloidal silica | 1 |
| | 331 | Histidine | 0.01 | Octyl phosphoric acid ester | 0.01 | Colloidal silica | 1 |
| | 332 | Arginine | 0.01 | Octyl phosphoric acid ester | 0.01 | Colloidal silica | 1 |
| | 333 | Aspartic acid | 0.01 | Potassium dodecylbenzenesulfonate | 0.01 | Colloidal silica | 1 |
| | 334 | Aspartic acid | 0.01 | Octyl phosphoric acid ester | 0.01 | Colloidal silica | 1 |

| | | Compositions | | | | Evaluation result | | | |
|---|---|---|---|---|---|---|---|---|---|
| | | Oxidizing agent | Addition amount (mass %) | pH adjusting agent | pH | Charge transfer resistance (kΩ/cm$^2$) | Corrosion observation result | Polishing rate (Å/min) | RC/(RA + RB) value |
| Example | 301 | Hydrogen peroxide | 1 | Maleic acid | 3 | 405 | Very Good | 320 | 1.4 |
| | 302 | Hydrogen peroxide | 1 | Maleic acid | 3 | 130 | Very Good | 341 | 1.2 |
| | 303 | Hydrogen peroxide | 1 | Maleic acid | 3 | 285 | Very Good | 345 | 4.3 |
| | 304 | Hydrogen peroxide | 1 | Maleic acid | 3 | 375 | Very Good | 306 | 2.3 |
| | 305 | Hydrogen peroxide | 1 | Maleic acid | 3 | 230 | Very Good | 332 | 3.3 |
| | 306 | Hydrogen peroxide | 1 | Maleic acid | 3 | 445 | Very Good | 305 | 2.7 |
| | 307 | Hydrogen peroxide | 1 | Maleic acid | 3 | 105 | Very Good | 330 | 2.9 |
| | 308 | Hydrogen peroxide | 1 | Maleic acid | 3 | 145 | Very Good | 323 | 1.3 |
| | 309 | Hydrogen peroxide | 1 | Maleic acid | 3 | 1,055 | Very Good | 280 | 1.2 |
| | 310 | Hydrogen peroxide | 1 | Maleic acid | 3 | 761 | Very Good | 289 | 4.4 |
| | 311 | Hydrogen peroxide | 1 | Maleic acid | 3 | 250 | Very Good | 291 | 1.7 |
| | 312 | Hydrogen peroxide | 1 | Maleic acid | 3 | 383 | Very Good | 295 | 1.7 |
| | 313 | Hydrogen peroxide | 1 | Maleic acid | 3 | 255 | Very Good | 320 | 1.6 |
| | 314 | Hydrogen peroxide | 1 | Maleic acid | 3 | 400 | Very Good | 317 | 1.8 |
| | 315 | Hydrogen peroxide | 1 | Maleic acid | 3 | 130 | Very Good | 353 | 1.1 |
| | 316 | Hydrogen peroxide | 1 | Maleic acid | 3 | 309 | Very Good | 305 | 1.8 |
| | 317 | Hydrogen peroxide | 1 | Maleic acid | 3 | 1,400 | Very Good | 297 | 1.4 |
| | 318 | Hydrogen peroxide | 1 | Maleic acid | 3 | 778 | Very Good | 299 | 3.2 |
| | 319 | Hydrogen peroxide | 1 | Maleic acid | 3 | 410 | Very Good | 342 | 2.3 |
| | 320 | Hydrogen peroxide | 1 | Maleic acid | 3 | 427 | Very Good | 285 | 1.4 |
| | 321 | Hydrogen peroxide | 1 | Maleic acid | 3 | 290 | Very Good | 348 | 1.6 |
| | 322 | Hydrogen peroxide | 1 | Maleic acid | 3 | 399 | Very Good | 287 | 1.3 |
| | 323 | Hydrogen peroxide | 1 | Maleic acid | 3 | 200 | Very Good | 316 | 1.3 |
| | 324 | Hydrogen peroxide | 1 | Maleic acid | 3 | 265 | Very Good | 300 | 1.1 |
| Comparative Example | 323 | Hydrogen peroxide | 1 | Maleic acid | 3 | 67 | Good | 334 | 0.6 |
| | 324 | Hydrogen peroxide | 1 | Maleic acid | 3 | 5 | Bad | 323 | 0.8 |
| | 325 | Hydrogen peroxide | 1 | Maleic acid | 3 | 5 | Bad | 301 | 0.8 |
| | 326 | Hydrogen peroxide | 1 | Maleic acid | 3 | 2 | Bad | 289 | 1 |
| | 327 | Hydrogen peroxide | 1 | Maleic acid | 3 | 2 | Bad | 309 | 1 |
| | 328 | Hydrogen peroxide | 1 | Maleic acid | 3 | 51 | Bad | 357 | 0.5 |
| | 329 | Hydrogen peroxide | 1 | Maleic acid | 3 | 1 | Bad | 354 | 0.5 |
| | 330 | Hydrogen peroxide | 1 | Maleic acid | 3 | 1 | Bad | 368 | 0.5 |
| | 331 | Hydrogen peroxide | 1 | Maleic acid | 3 | 50 | Good | 389 | 0.9 |
| | 332 | Hydrogen peroxide | 1 | Maleic acid | 3 | 46 | Good | 337 | 0.8 |
| | 333 | Hydrogen peroxide | 1 | Maleic acid | 3 | 1 | Bad | 309 | 0.5 |
| | 334 | Hydrogen peroxide | 1 | Maleic acid | 3 | 1 | Bad | 343 | 0.5 |

TABLE 9

| | | Compositions | | | | | |
|---|---|---|---|---|---|---|---|
| | | Component (A) | Addition amount (mass %) | Component (B) | Addition amount (mass %) | Abrasive grains | Addition amount (mass %) |
| Comparative Example | 335 | Arginine | 0.005 | — | — | Colloidal silica | 1 |
| | 336 | Arginine | 0.005 | — | — | Colloidal silica | 1 |
| | 337 | Arginine | 0.005 | — | — | Colloidal silica | 1 |
| | 338 | Arginine | 0.005 | — | — | Colloidal silica | 1 |
| | 339 | Arginine | 0.005 | — | — | Colloidal silica | 1 |

TABLE 9-continued

|  |  | Amino acid | Addition amount (mass %) | Surfactant | Addition amount (mass %) | Abrasive grain | Addition amount (mass %) |
|---|---|---|---|---|---|---|---|
|  | 340 | Arginine | 0.005 | — |  | Colloidal silica | 1 |
|  | 341 | Arginine | 0.005 | — |  | Colloidal silica | 1 |
|  | 342 | Arginine | 0.01 | — |  | Colloidal silica | 1 |
|  | 343 | Arginine | 0.01 | — |  | Colloidal silica | 1 |
|  | 344 | Arginine | 0.01 | — |  | Colloidal silica | 1 |
|  | 345 | Arginine | 0.01 | — |  | Colloidal silica | 1 |
|  | 346 | Arginine | 0.01 | — |  | Colloidal silica | 1 |
|  | 347 | Arginine | 0.01 | — |  | Colloidal silica | 1 |
|  | 348 | Arginine | 0.01 | — |  | Colloidal silica | 1 |
|  | 349 | — | — | Lauryldimethylaminoacetic acid betaine | 0.005 | Colloidal silica | 1 |
|  | 350 | — | — | Lauryldimethylaminoacetic acid betaine | 0.005 | Colloidal silica | 1 |
|  | 351 | — | — | Lauryldimethylaminoacetic acid betaine | 0.005 | Colloidal silica | 1 |
|  | 352 | — | — | Lauryldimethylaminoacetic acid betaine | 0.005 | Colloidal silica | 1 |
|  | 353 | — | — | Lauryldimethylaminoacetic acid betaine | 0.005 | Colloidal silica | 1 |
|  | 354 | — | — | Lauryldimethylaminoacetic acid betaine | 0.005 | Colloidal silica | 1 |
|  | 355 | — | — | Lauryldimethylaminoacetic acid betaine | 0.005 | Colloidal silica | 1 |
|  | 356 | — | — | Lauryldimethylaminoacetic acid betaine | 0.01 | Colloidal silica | 1 |
|  | 357 | — | — | Lauryldimethylaminoacetic acid betaine | 0.01 | Colloidal silica | 1 |
|  | 358 | — | — | Lauryldimethylaminoacetic acid betaine | 0.01 | Colloidal silica | 1 |
|  | 359 | — | — | Lauryldimethylaminoacetic acid betaine | 0.01 | Colloidal silica | 1 |
|  | 360 | — | — | Lauryldimethylaminoacetic acid betaine | 0.01 | Colloidal silica | 1 |
|  | 361 | — | — | Lauryldimethylaminoacetic acid betaine | 0.01 | Colloidal silica | 1 |
|  | 362 | — | — | Lauryldimethylaminoacetic acid betaine | 0.01 | Colloidal silica | 1 |
| Example | 325 | Arginine | 0.005 | Lauryldimethylaminoacetic acid betaine | 0.005 | Colloidal silica | 1 |
|  | 326 | Arginine | 0.005 | Lauryldimethylaminoacetic acid betaine | 0.005 | Colloidal silica | 1 |
|  | 327 | Arginine | 0.005 | Lauryldimethylaminoacetic acid betaine | 0.005 | Colloidal silica | 1 |
|  | 328 | Arginine | 0.005 | Lauryldimethylaminoacetic acid betaine | 0.005 | Colloidal silica | 1 |
|  | 329 | Arginine | 0.005 | Lauryldimethylaminoacetic acid betaine | 0.005 | Colloidal silica | 1 |
|  | 330 | Arginine | 0.005 | Lauryldimethylaminoacetic acid betaine | 0.005 | Colloidal silica | 1 |
|  | 331 | Arginine | 0.005 | Lauryldimethylaminoacetic acid betaine | 0.005 | Colloidal silica | 1 |
|  | 332 | Arginine | 0.01 | Lauryldimethylaminoacetic acid betaine | 0.01 | Colloidal silica | 1 |
|  | 333 | Arginine | 0.01 | Lauryldimethylaminoacetic acid betaine | 0.01 | Colloidal silica | 1 |
|  | 334 | Arginine | 0.01 | Lauryldimethylaminoacetic acid betaine | 0.01 | Colloidal silica | 1 |
|  | 335 | Arginine | 0.01 | Lauryldimethylaminoacetic acid betaine | 0.01 | Colloidal silica | 1 |
|  | 336 | Arginine | 0.01 | Lauryldimethylaminoacetic acid betaine | 0.01 | Colloidal silica | 1 |
|  | 337 | Arginine | 0.01 | Lauryldimethylaminoacetic acid betaine | 0.01 | Colloidal silica | 1 |
|  | 338 | Arginine | 0.01 | Lauryldimethylaminoacetic acid betaine | 0.01 | Colloidal silica | 1 |

|  |  | Compositions | | | | Evaluation result | | | |
|---|---|---|---|---|---|---|---|---|---|
|  |  | Oxidizing agent | Addition amount (mass %) | pH adjusting agent | pH | Charge transfer resistance (kΩ/cm$^2$) | Corrosion observation result | Polishing rate (Å/min) | RC/(RA + RB) value |
| Comparative Example | 335 | Hydrogen peroxide | 2 | Maleic acid | 3 | 9 | Bad | 421 | — |
|  | 336 | Hydrogen peroxide | 3 | Maleic acid | 3 | 3 | Bad | 470 | — |
|  | 337 | Hydrogen peroxide | 1 | Maleic acid | 1 | 19 | Bad | 301 | — |
|  | 338 | Hydrogen peroxide | 1 | Maleic acid | 2 | 22 | Bad | 318 | — |
|  | 339 | Hydrogen peroxide | 1 | Maleic acid | 4 | 30 | Good | 320 | — |
|  | 340 | Hydrogen peroxide | 1 | Nitric acid | 3 | 29 | Bad | 352 | — |
|  | 341 | Hydrogen peroxide | 1 | Phosphoric acid | 3 | 28 | Bad | 356 | — |
|  | 342 | Hydrogen peroxide | 2 | Maleic acid | 3 | 25 | Bad | 409 | — |
|  | 343 | Hydrogen peroxide | 3 | Maleic acid | 3 | 18 | Bad | 440 | — |
|  | 344 | Hydrogen peroxide | 1 | Maleic acid | 1 | 30 | Bad | 290 | — |
|  | 345 | Hydrogen peroxide | 1 | Maleic acid | 2 | 50 | Bad | 298 | — |
|  | 346 | Hydrogen peroxide | 1 | Maleic acid | 4 | 53 | Good | 313 | — |
|  | 347 | Hydrogen peroxide | 1 | Nitric acid | 3 | 56 | Good | 334 | — |
|  | 348 | Hydrogen peroxide | 1 | Phosphoric acid | 3 | 55 | Good | 349 | — |
|  | 349 | Hydrogen peroxide | 2 | Maleic acid | 3 | 53 | Good | 420 | — |
|  | 350 | Hydrogen peroxide | 3 | Maleic acid | 3 | 30 | Good | 458 | — |
|  | 351 | Hydrogen peroxide | 1 | Maleic acid | 1 | 28 | Good | 189 | — |
|  | 352 | Hydrogen peroxide | 1 | Maleic acid | 2 | 79 | Good | 309 | — |
|  | 353 | Hydrogen peroxide | 1 | Maleic acid | 4 | 89 | Good | 340 | — |
|  | 354 | Hydrogen peroxide | 1 | Nitric acid | 3 | 85 | Good | 325 | — |
|  | 355 | Hydrogen peroxide | 1 | Phosphoric acid | 3 | 79 | Good | 353 | — |
|  | 356 | Hydrogen peroxide | 2 | Maleic acid | 3 | 85 | Good | 389 | — |
|  | 357 | Hydrogen peroxide | 3 | Maleic acid | 3 | 57 | Good | 396 | — |
|  | 358 | Hydrogen peroxide | 1 | Maleic acid | 1 | 53 | Very Good | 226 | — |
|  | 359 | Hydrogen peroxide | 1 | Maleic acid | 2 | 120 | Very Good | 289 | — |
|  | 360 | Hydrogen peroxide | 1 | Maleic acid | 4 | 123 | Very Good | 291 | — |
|  | 361 | Hydrogen peroxide | 1 | Nitric acid | 3 | 105 | Very Good | 320 | — |
|  | 362 | Hydrogen peroxide | 1 | Phosphoric acid | 3 | 112 | Very Good | 329 | — |
| Example | 325 | Hydrogen peroxide | 2 | Maleic acid | 3 | 290 | Very Good | 353 | 4.7 |
|  | 326 | Hydrogen peroxide | 3 | Maleic acid | 3 | 220 | Very Good | 421 | 6.7 |
|  | 327 | Hydrogen peroxide | 1 | Maleic acid | 1 | 185 | Very Good | 189 | 3.9 |
|  | 328 | Hydrogen peroxide | 1 | Maleic acid | 2 | 395 | Very Good | 230 | 3.9 |
|  | 329 | Hydrogen peroxide | 1 | Maleic acid | 4 | 375 | Very Good | 278 | 3.2 |
|  | 330 | Hydrogen peroxide | 1 | Nitric acid | 3 | 320 | Very Good | 321 | 2.8 |

TABLE 9-continued

| | | | | | | | | |
|---|---|---|---|---|---|---|---|---|
| 331 | Hydrogen peroxide | 1 | Phosphoric acid | 3 | 380 | Very Good | 346 | 3.6 |
| 332 | Hydrogen peroxide | 2 | Maleic acid | 3 | 420 | Very Good | 339 | 3.8 |
| 333 | Hydrogen peroxide | 3 | Maleic acid | 3 | 350 | Very Good | 354 | 4.7 |
| 334 | Hydrogen peroxide | 1 | Maleic acid | 1 | 240 | Very Good | 189 | 2.9 |
| 335 | Hydrogen peroxide | 1 | Maleic acid | 2 | 440 | Very Good | 212 | 2.6 |
| 336 | Hydrogen peroxide | 1 | Maleic acid | 4 | 430 | Very Good | 289 | 2.4 |
| 337 | Hydrogen peroxide | 1 | Nitric acid | 3 | 430 | Very Good | 301 | 2.7 |
| 338 | Hydrogen peroxide | 1 | Phosphoric acid | 3 | 445 | Very Good | 333 | 2.7 |

As apparent from Comparative Examples 302 to 322 and 335 to 362, none of the chemical mechanical polishing compositions each prepared using the component (A) or the component (B) alone except Comparative Examples 313 to 320 and 358 to 362 achieved satisfactory corrosion suppression. This is presumably because the charge transfer resistance value is 100 kΩ/cm² or less, and hence the oxidation rate is high. In addition, also in each of Comparative Examples 323 to 334, satisfactory corrosion suppression was not achieved. This is presumably because the relational expression RC/(RA+RB) of the charge transfer resistances is 1 or less, and hence a synergy effect does not act between the component (A) and the component (B).

In the case of using lauryldimethylaminoacetic acid betaine alone as the component (B), when its addition amount is 0.01 mass % or more and the amount of the oxidizing agent is 1 mass %, satisfactory corrosion suppression is achieved, but it is surmised that the effect is weakened when the addition amount is less than 0.01 mass % or the concentration of the oxidizing agent is increased.

In contrast, in each of Examples 301 to 324, satisfactory corrosion suppression was achieved. This is presumably because in each of Examples 301 to 324, the relational expression RC/(RA+RB) of the charge transfer resistances is more than 1, and a synergy effect acts between the component (A) and the component (B), and hence the charge transfer resistance value becomes more than 100 kΩ/cm².

In addition, as apparent from Table 9, in each of Examples 325 to 338, satisfactory corrosion suppression was achieved. This is presumably because, irrespective of the addition amounts of additives, the addition amount of the oxidizing agent, the kind of the pH adjusting agent, and the pH value, the relational expression RC/(RA+RB) of the charge transfer resistances is more than 1, and a synergy effect acts between the component (A) and the component (B), and hence the charge transfer resistance value becomes more than 100 kΩ/cm². Thus, it has been demonstrated that when the relational expression RC/(RA+RB) of the charge transfer resistances is more than 1, a satisfactory tungsten corrosion suppression ability is expressed irrespective of the addition amounts of the additives, the addition amount of the oxidizing agent, the kind of the pH adjusting agent, and the pH value. In particular, as demonstrated in Comparative Examples 356 and 357, when lauryldimethylaminoacetic acid betaine was used alone, the result was that the corrosion-suppressing effect decreased with an increase in amount of the oxidizing agent, but as demonstrated in Examples 325, 326, 332, and 333, through the combined use with arginine serving as the component (A), corrosion suppression was possible even when the amount of the oxidizing agent was increased.

3.4. Examples of Cleaning Composition 3.4.1. Preparation of Cleaning Composition Comparative Example 401

Components shown in Table 10 were loaded into a container made of polyethylene, and ion-exchanged water and maleic acid serving as a pH adjusting agent were added so as to achieve a total amount of constituent components of 100 mass % and adjust pH to 3. The mixture was stirred for 15 minutes to provide a cleaning composition of Comparative Example 401.

Comparative Examples 402 to 419

On the basis of Comparative Example 401, cleaning compositions each containing the component (A) or the component (B) shown in Table 10 were prepared, and defined as Comparative Examples 402 to 419.

Comparative Examples 420 to 440

On the basis of Comparative Example 401, cleaning compositions each containing the component (A) and the component (B) shown in Table 11 were prepared, and defined as Comparative Examples 420 to 440.

Examples 401 to 425

On the basis of Comparative Example 401, cleaning compositions each containing the component (A) and the component (B) shown in Table 12 were prepared, and defined as Examples 401 to 425.

Comparative Examples 441 to 454 and Examples 426 to 435

Next, in accordance with compositions shown in Table 13, on the basis of Examples 410, 412, and 419, various cleaning compositions were prepared by changing the addition amounts of the component (A) and the component (B), the kind of the pH adjusting agent, and the pH value, and were defined as Comparative Examples 441 to 454 and Examples 426 to 435.

3.4.2. Evaluation Methods 3.4.2.1. Evaluation of Charge Transfer Resistance

Charge transfer resistances were evaluated in the same manner as in the section 3.1.2.1. above except that the evaluation was performed at 45° C. using each obtained cleaning composition.

3.4.2.2. Evaluation of Corrosion Observation

Corrosion was observed in the same manner as in the section 3.1.2.2. above except that the evaluation was performed at 45° C. using each obtained cleaning composition. Evaluation criteria for the corrosion are as described below.

Very Good: A case in which no change in shape of the surface due to corrosion is found as compared to that before the immersion is determined as a particularly satisfactory result.

Good: A case in which a site corroded as compared to that before the immersion and a non-corroded site are mixed is determined as a satisfactory result.

Bad: A case in which the entire surface is corroded as compared to that before the immersion is determined as a poor result.

3.4.2.3. Defect Evaluation

Tungsten cut wafers each having a size of 3 cm×3 cm subjected to chemical mechanical polishing treatment in advance using the chemical mechanical polishing composition of Comparative Example 119 by the method of the section 3.1.2.3, above were prepared. Five sites of each of the cut wafers were observed at a frame size of 10 μm using Dimension FastScan, which was a scanning atomic force microscope (AFM) manufactured by Bruker Corporation. Only those tungsten cut wafers that were found to have a flat surface having an average value of the arithmetic average roughnesses of the five sites of 0.1 nm or less were used for defect evaluation. Each of the cut wafers was subjected to immersion treatment in the cleaning composition in the same manner as in the section 3.4.2.2, above, and five sites were observed at a frame size of 10 μm using the AFM. For the resultant five images, the total number of deposits each having a height of 2.0 nm or more counted with image analysis software was defined as the number of defects. Evaluation criteria are as described below.

Good: A number of defects of less than 500 is determined as a satisfactory result.

Bad: A number of defects of 500 or more is determined as a poor result.

3.4.3. Evaluation Results

The compositions of the cleaning compositions obtained in Comparative Examples 401 to 419, and their evaluation results are shown in Table 10 below. The compositions of the cleaning compositions obtained in Comparative Examples 420 to 440, and their evaluation results are shown in Table 11 below. The compositions of the cleaning compositions obtained in Examples 401 to 425, and their evaluation results are shown in Table 12 below. The compositions of the cleaning compositions obtained in Comparative Examples 441 to 454 and Examples 426 to 435, and their evaluation results are shown in Table 13 below.

TABLE 10

| | | Compositions | | | |
|---|---|---|---|---|---|
| | | Component (A) | Addition amount (mass %) | Component (B) | Addition amount (mass %) |
| Comparative Example | 401 | — | — | — | — |
| | 402 | Piperazine | 0.01 | — | — |
| | 403 | N-(2-Aminoethyl)piperazine | 0.01 | — | — |
| | 404 | N,N'-Bis(3-propylamino)piperazine | 0.01 | — | — |
| | 405 | Histidine | 0.01 | — | — |
| | 406 | Arginine | 0.01 | — | — |
| | 407 | Aspartic acid | 0.01 | — | — |
| | 408 | 2-Pyridinemethanol | 0.01 | — | — |
| | 409 | Quinolinic acid | 0.01 | — | — |
| | 410 | Quinaldic acid | 0.01 | — | — |
| | 411 | — | — | Laurylaminodipropionic acid betaine | 0.01 |
| | 412 | — | — | 2-Lauryl-N-carboxymethyl-N-hydroxyethylimidazolinium betaine | 0.01 |
| | 413 | — | — | Lauryldimethylaminoacetic acid betaine | 0.01 |
| | 414 | — | — | Dipotassium alkenylsuccinate | 0.01 |
| | 415 | — | — | Potassium dodecylbenzenesulfonate | 0.01 |
| | 416 | — | — | Laurlsulfuric acid ester | 0.01 |
| | 417 | — | — | Octyl phosphoric acid ester | 0.01 |
| | 418 | — | — | 2,4,7,9-Tetramethyl-5-decyne-4,7-oligoethylene glycol | 0.01 |
| | 419 | — | — | Polyacrylic acid (JURYMER AC-10L) | 0.01 |

| | | Compositions | | Evaluation result | | | |
|---|---|---|---|---|---|---|---|
| | | pH adjusting agent | pH | Charge transfer resistance (kΩ/cm$^2$) | Corrosion observation result | Number of defects (defects) Good: less than 500 Bad: 500 or less | RC/(RA + RB) value |
| Comparative Example | 401 | Maleic acid | 3 | 100 | Bad | Bad | — |
| | 402 | Maleic acid | 3 | 120 | Bad | Bad | — |
| | 403 | Maleic acid | 3 | 890 | Good | Bad | — |
| | 404 | Maleic acid | 3 | 3,600 | Very Good | Bad | — |
| | 405 | Maleic acid | 3 | 410 | Good | Good | — |
| | 406 | Maleic acid | 3 | 550 | Good | Bad | — |
| | 407 | Maleic acid | 3 | 90 | Bad | Bad | — |
| | 408 | Maleic acid | 3 | 210 | Bad | Bad | — |
| | 409 | Maleic acid | 3 | 90 | Bad | Bad | — |
| | 410 | Maleic acid | 3 | 80 | Bad | Bad | — |
| | 411 | Maleic acid | 3 | 3,500 | Very Good | Good | — |
| | 412 | Maleic acid | 3 | 3,430 | Very Good | Bad | — |

TABLE 10-continued

| | | | | | | |
|---|---|---|---|---|---|---|
| | 413 | Maleic acid | 3 | 6,540 | Very Good | Bad | — |
| | 414 | Maleic acid | 3 | 100 | Bad | Bad | — |
| | 415 | Maleic acid | 3 | 110 | Bad | Good | — |
| | 416 | Maleic acid | 3 | 110 | Bad | Good | — |
| | 417 | Maleic acid | 3 | 120 | Bad | Bad | — |
| | 418 | Maleic acid | 3 | 130 | Bad | Bad | — |
| | 419 | Maleic acid | 3 | 110 | Bad | Good | — |

TABLE 11

| | | Compositions | | | | |
|---|---|---|---|---|---|---|
| | | Component (A) | Addition amount (mass %) | Component (B) | Addition amount (mass %) | |
| Comparative Example | 420 | Piperazine | 0.01 | Lauryldimethylaminoacetic acid betaine | 0.01 | |
| | 421 | Piperazine | 0.01 | 2,4,7,9-Tetramethyl-5-decyne-4,7-oligoethylene glycol | 0.01 | |
| | 422 | N-(2-Aminoethyl)piperazine | 0.01 | Lauryldimethylaminoacetic acid betaine | 0.01 | |
| | 423 | N-(2-Aminoethyl)piperazine | 0.01 | 2,4,7,9-Tetramethyl-5-decyne-4,7-oligoethylene glycol | 0.01 | |
| | 424 | N,N,'-Bis(3-propylamino)piperazine | 0.01 | Lauryldimethylaminoacetic acid betaine | 0.01 | |
| | 425 | N,N,'-Bis(3-propylamino)piperazine | 0.01 | 2,4,7,9-Tetramethyl-5-decyne-4,7-oligoethylene glycol | 0.01 | |
| | 426 | Histidine | 0.01 | Octyl phosphoric acid ester | 0.01 | |
| | 427 | Histidine | 0.01 | Polyacrylic acid (JURYMER AC-10L) | 0.01 | |
| | 428 | Arginine | 0.01 | Octyl phosphoric acid ester | 0.01 | |
| | 429 | Arginine | 0.01 | Polyacrylic acid (JURYMER AC-10L) | 0.01 | |
| | 430 | Aspartic acid | 0.01 | Potassium dodecylbenzenesulfonate | 0.01 | |
| | 431 | Aspartic acid | 0.01 | Octyl phosphoric acid ester | 0.01 | |
| | 432 | Aspartic acid | 0.01 | Polyacrylic acid (JURYMER AC-10L) | 0.01 | |
| | 433 | 2-Pyridinemethanol | 0.01 | Lauryldimethylaminoacetic acid betaine | 0.01 | |
| | 434 | 2-Pyridinemethanol | 0.01 | Potassium dodecylbenzenesulfonate | 0.01 | |
| | 435 | 2-Pyridinemethanol | 0.01 | Octyl phosphoric acid ester | 0.01 | |
| | 436 | Quinolinic acid | 0.01 | Potassium dodecylbenzenesulfonate | 0.01 | |
| | 437 | Quinolinic acid | 0.01 | Octyl phosphoric acid ester | 0.01 | |
| | 438 | Quinaldic acid | 0.01 | Lauryldimethylaminoacetic acid betaine | 0.01 | |
| | 439 | Quinaldic acid | 0.01 | Potassium dodecylbenzenesulfonate | 0.01 | |
| | 440 | Quinaldic acid | 0.01 | Octyl phosphoric acid ester | 0.01 | |

| | | Compositions | | Evaluation result | | | |
|---|---|---|---|---|---|---|---|
| | | pH adjusting agent | pH | Charge tranfer resistance (kΩ/cm$^2$) | Corrosion observation result | Number of defects (defects) Good: less than 500 Bad: 500 or less | RC/(RA + RB) value |
| Comparative Example | 420 | Maleic acid | 3 | 420 | Bad | Bad | 0.1 |
| | 421 | Maleic acid | 3 | 120 | Bad | Bad | 0.5 |
| | 422 | Maleic acid | 3 | 590 | Bad | Bad | 0.1 |
| | 423 | Maleic acid | 3 | 380 | Bad | Bad | 0.4 |
| | 424 | Maleic acid | 3 | 420 | Bad | Bad | 0.04 |
| | 425 | Maleic acid | 3 | 300 | Bad | Bad | 0.1 |
| | 426 | Maleic acid | 3 | 310 | Good | Good | 0.6 |
| | 427 | Maleic acid | 3 | 300 | Good | Good | 0.6 |
| | 428 | Maleic acid | 3 | 450 | Good | Bad | 0.7 |
| | 429 | Maleic acid | 3 | 430 | Good | Good | 0.7 |
| | 430 | Maleic acid | 3 | 120 | Bad | Good | 0.6 |
| | 431 | Maleic acid | 3 | 120 | Bad | Bad | 0.6 |
| | 432 | Maleic acid | 3 | 90 | Bad | Good | 0.5 |
| | 433 | Maleic acid | 3 | 600 | Good | Bad | 0.1 |
| | 434 | Maleic acid | 3 | 220 | Bad | Bad | 0.7 |
| | 435 | Maleic acid | 3 | 230 | Bad | Bad | 0.7 |
| | 436 | Maleic acid | 3 | 180 | Bad | Bad | 0.9 |
| | 437 | Maleic acid | 3 | 190 | Bad | Bad | 0.9 |
| | 438 | Maleic acid | 3 | 90 | Bad | Bad | 0.01 |
| | 439 | Maleic acid | 3 | 90 | Bad | Bad | 0.5 |
| | 440 | Maleic acid | 3 | 80 | Bad | Bad | 0.4 |

TABLE 12

| | | Component (A) | Addition amount (mass %) | Component (B) | Addition amount (mass %) |
|---|---|---|---|---|---|
| Example | 401 | Piperazine | 0.01 | Potassium dodecylbenzenesulfonate | 0.01 |
| | 402 | N-(2-Aminoethyl)piperazine | 0.01 | Dipotassium alkenylsuccinate | 0.01 |
| | 403 | N-(2-Aminoethyl)piperazine | 0.01 | Potassium alkenylbenzenesulfonate | 0.01 |
| | 404 | N-(2-Aminoethyl)piperazine | 0.01 | Octyl phosphoric acid ester | 0.01 |
| | 405 | N-(2-Aminoethyl)piperazine | 0.01 | Polyacrylic acid (JURYMER AC-10L) | 0.01 |
| | 406 | N,N,'-Bis(3-propylamino)piperazine | 0.01 | Dipotassium alkenylsuccinate | 0.01 |
| | 407 | N,N,'-Bis(3-propylamino)piperazine | 0.01 | Potassium dodecylbenzenesulfonate | 0.01 |
| | 408 | N,N,'-Bis(3-propylamino)piperazine | 0.01 | Octyl phosphoric acid ester | 0.01 |
| | 409 | N,N,'-Bis(3-propylamino)piperazine | 0.01 | Polyacrylic acid (JURYMER AC-10L) | 0.01 |
| | 410 | Histidine | 0.01 | Potassium dodecylbenzenesulfonate | 0.01 |
| | 411 | Arginine | 0.01 | Potassium dodecylbenzenesulfonate | 0.01 |
| | 412 | Histidine | 0.01 | Laurylsulfuric acid ester | 0.01 |
| | 413 | Arginine | 0.01 | Laurylsulfuric acid ester | 0.01 |
| | 414 | Quinolinic acid | 0.01 | Lauryldimethylaminoacetic acid betaine | 0.01 |
| | 415 | Histidine | 0.01 | Lauryldimethylaminoacetic acid betaine | 0.01 |
| | 416 | Arginine | 0.01 | Lauryldimethylaminoacetic acid betaine | 0.01 |
| | 417 | Aspartic acid | 0.01 | Lauryldimethylaminoacetic acid betaine | 0.01 |
| | 418 | Quinolinic acid | 0.01 | Laurylaminodipropionic acid betaine | 0.01 |
| | 419 | Histidine | 0.01 | Laurylaminodipropionic acid betaine | 0.01 |
| | 420 | Arginine | 0.01 | Laurylaminodipropionic acid betaine | 0.01 |
| | 421 | Aspartic acid | 0.01 | Laurylaminodipropionic acid betaine | 0.01 |
| | 422 | Quinolinic acid | 0.01 | 2-Lauryl-N-carboxymethyl-N-hydroxyethylimidazolinium betaine | 0.01 |
| | 423 | Histidine | 0.01 | 2-Lauryl-N-carboxymethyl-N-hydroxyethylimidazolinium betaine | 0.01 |
| | 424 | Arginine | 0.01 | 2-Lauryl-N-carboxymethyl-N-hydroxyethylimidazolinium betaine | 0.01 |
| | 425 | Aspartic acid | 0.01 | 2-Lauryl-N-carboxymethyl-N-hydroxyethylimidazolinium betaine | 0.01 |

| | | Compositions | | Evaluation result | | | |
|---|---|---|---|---|---|---|---|
| | | pH adjusting agent | pH | Charge transfer resistance (kΩ/cm$^2$) | Corrosion observation result | Number of defects (defects) Good: less than 500 Bad: 500 or less | RC/(RA + RB) value |
| Example | 401 | Maleic acid | 3 | 13,400 | Very Good | Good | 58 |
| | 402 | Maleic acid | 3 | 32,100 | Very Good | Bad | 32 |
| | 403 | Maleic acid | 3 | 25,800 | Very Good | Good | 26 |
| | 404 | Maleic acid | 3 | 49,000 | Very Good | Bad | 49 |
| | 405 | Maleic acid | 3 | 7,000 | Very Good | Good | 7 |
| | 406 | Maleic acid | 3 | 10,900 | Very Good | Bad | 3 |
| | 407 | Maleic acid | 3 | 40,300 | Very Good | Good | 11 |
| | 408 | Maleic acid | 3 | 30,700 | Very Good | Bad | 8 |
| | 409 | Maleic acid | 3 | 20,000 | Very Good | Bad | 5 |
| | 410 | Maleic acid | 3 | 23,600 | Very Good | Good | 45 |
| | 411 | Maleic acid | 3 | 20,500 | Very Good | Good | 31 |
| | 412 | Maleic acid | 3 | 21,000 | Very Good | Good | 40 |
| | 413 | Maleic acid | 3 | 23,900 | Very Good | Good | 36 |
| | 414 | Maleic acid | 3 | 8,050 | Very Good | Bad | 1.2 |
| | 415 | Maleic acid | 3 | 8,000 | Very Good | Good | 1.2 |
| | 416 | Maleic acid | 3 | 8,590 | Very Good | Bad | 1.2 |
| | 417 | Maleic acid | 3 | 11,200 | Very Good | Bad | 1.7 |
| | 418 | Maleic acid | 3 | 7,700 | Very Good | Bad | 2.1 |
| | 419 | Maleic acid | 3 | 8,400 | Very Good | Good | 2.1 |
| | 420 | Maleic acid | 3 | 21,200 | Very Good | Good | 5.2 |
| | 421 | Maleic acid | 3 | 20,500 | Very Good | Good | 5.7 |
| | 422 | Maleic acid | 3 | 19,800 | Very Good | Bad | 5.6 |
| | 423 | Maleic acid | 3 | 12,000 | Very Good | Good | 3.1 |
| | 424 | Maleic acid | 3 | 20,000 | Very Good | Bad | 5.0 |
| | 425 | Maleic acid | 3 | 23,700 | Very Good | Bad | 6.7 |

TABLE 13

| | | Component (A) | Addition amount (mass %) | Component (B) | Addition amount (mass %) |
|---|---|---|---|---|---|
| Comparative Example | 441 | Histidine | 0.002 | — | — |
| | 442 | Histidine | 0.05 | — | — |
| | 443 | Histidine | 0.01 | — | — |

TABLE 13-continued

|  |  | # | pH adjusting agent | conc (%) | Surfactant | conc (%) |
|---|---|---|---|---|---|---|
|  |  | 444 | Histidine | 0.01 | — | — |
|  |  | 445 | Histidine | 0.01 | — | — |
|  |  | 446 | Histidine | 0.01 | — | — |
|  |  | 447 | — | — | Potassium dodecylbenzenesulfonate | 0.01 |
|  |  | 448 | — | — | Potassium dodecylbenzenesulfonate | 0.02 |
|  |  | 449 | — | — | Laurylsulfuric acid ester | 0.002 |
|  |  | 450 | — | — | Laurylaminodipropionic acid betaine | 0.002 |
|  |  | 451 | — | — | Potassium dodecylbenzenesulfonate | 0.01 |
|  |  | 452 | — | — | Potassium dodecylbenzenesulfonate | 0.01 |
|  |  | 453 | — | — | Potassium dodecylbenzenesulfonate | 0.01 |
|  |  | 454 | — | — | Potassium dodecylbenzenesulfonate | 0.01 |
| Example |  | 426 | Histidine | 0.002 | Potassium dodecylbenzenesulfonate | 0.002 |
|  |  | 427 | Histidine | 0.002 | Potassium dodecylbenzenesulfonate | 0.02 |
|  |  | 428 | Histidine | 0.05 | Potassium dodecylbenzenesulfonate | 0.002 |
|  |  | 429 | Histidine | 0.05 | Potassium dodecylbenzenesulfonate | 0.02 |
|  |  | 430 | Histidine | 0.002 | Laurylsulfuric acid ester | 0.002 |
|  |  | 431 | Histidine | 0.002 | Laurylaminodipropionic acid betaine | 0.002 |
|  |  | 432 | Histidine | 0.01 | Potassium dodecylbenzenesulfonate | 0.01 |
|  |  | 433 | Histidine | 0.01 | Potassium dodecylbenzenesulfonate | 0.01 |
|  |  | 434 | Histidine | 0.01 | Potassium dodecylbenzenesulfonate | 0.01 |
|  |  | 435 | Histidine | 0.01 | Potassium dodecylbenzenesulfonate | 0.01 |

|  |  |  | Compositions | | Evaluation result | | | |
|---|---|---|---|---|---|---|---|---|
|  |  |  | pH adjusting agent | pH | Charge transfer resistance (k$\Omega$/cm$^2$) | Corrosion observation result | Number of defects (defects) Good: less than 500 Bad: 500 or less | RC/(RA + RB) value |
| Comparative Example | 441 | Maleic acid | 3 | 180 | Good | Bad | — |
|  | 442 | Maleic acid | 3 | 550 | Good | Good | — |
|  | 443 | Maleic acid | 5 | 85 | Bad | Good | — |
|  | 444 | Maleic acid | 2.2 | 230 | Bad | Bad | — |
|  | 445 | Phosphoric acid | 3 | 420 | Good | Good | — |
|  | 446 | Nitric acid | 3 | 410 | Good | Good | — |
|  | 447 | Maleic acid | 3 | 100 | Bad | Bad | — |
|  | 448 | Maleic acid | 3 | 95 | Bad | Bad | — |
|  | 449 | Maleic acid | 3 | 100 | Bad | Bad | — |
|  | 450 | Maleic acid | 3 | 950 | Good | Bad | — |
|  | 451 | Maleic acid | 5 | 28 | Bad | Bad | — |
|  | 452 | Maleic acid | 2.2 | 50 | Bad | Bad | — |
|  | 453 | Phosphoric acid | 3 | 100 | Bat | Bad | — |
|  | 454 | Nitric acid | 3 | 60 | Bad | Bad | — |
| Example | 426 | Maleic acid | 3 | 2,240 | Very Good | Good | 8 |
|  | 427 | Maleic acid | 3 | 3,200 | Very Good | Good | 12 |
|  | 428 | Maleic acid | 3 | 12,900 | Very Good | Good | 20 |
|  | 429 | Maleic acid | 3 | 43,400 | Very Good | Good | 67 |
|  | 430 | Maleic acid | 3 | 1,690 | Very Good | Good | 6 |
|  | 431 | Maleic acid | 3 | 2,300 | Very Good | Good | 2 |
|  | 432 | Maleic acid | 5 | 1,120 | Very Good | Good | 10 |
|  | 433 | Maleic acid | 2.2 | 10,800 | Very Good | Good | 39 |
|  | 434 | Phosphoric acid | 3 | 18,900 | Very Good | Good | 36 |
|  | 435 | Nitric acid | 3 | 20,100 | Very Good | Good | 43 |

As apparent from Comparative Examples 401 to 419, the results of the tungsten corrosion evaluation using the compositions each prepared using the component (A) or the component (B) alone were that satisfactory corrosion suppression was not achieved in each of the comparative examples except Comparative Examples 404 and 411 to 413. This is presumably because the charge transfer resistance value of tungsten is 1,000 k$\Omega$/cm$^2$ or less, and hence the oxidation rate is high.

In addition, as apparent from Comparative Examples 420 to 440, and Comparative Examples 441 to 454, also in each of the cases of using the compositions each containing both the component (A) and the component (B), satisfactory corrosion suppression was not achieved. This is presumably because the relational expression RC/(RA+RB) of the charge transfer resistances as defined in claim 1 is 1 or less, and a synergy effect does not act between the component (A) and the component (B).

In contrast, as apparent from Examples 401 to 425, in each of the cases of containing both the component (A) and the component (B), satisfactory corrosion suppression was achieved. This is presumably because the relational expression RC/(RA+RB) of the charge transfer resistances as defined in claim 1 was 1 or more. Thus, Examples 401 to 425 have demonstrated that when a synergy effect acts between the component (A) and the component (B) to increase the charge transfer resistance value to 1,000 k$\Omega$/cm$^2$ or more, tungsten corrosion suppression is possible.

In addition, also in each of Examples 426 to 435, satisfactory corrosion suppression was achieved. This is presumably because the relational expression RC/(RA+RB) using the charge transfer resistances RA, RB, and RC as defined in claim 1 was 1 or more, and a synergy effect acted between the component (A) and the component (B) to increase the charge transfer resistance value to 1,000 k$\Omega$/cm$^2$ or more. Thus, Examples 426 to 435 have demonstrated that a satisfactory tungsten corrosion suppression ability is expressed irrespective of the concentrations of the component (A) and the component (B), the pH, and the kind of the pH adjusting agent.

The invention is not limited to the embodiments described above, and various modifications may be made thereto. The invention encompasses substantially the same configurations as the configurations described in the embodiments (e.g., configurations having the same functions, methods, and results, or configurations having the same objects and effects). In addition, the invention encompasses configurations obtained by replacing non-essential parts of the configurations described in the embodiments with other configurations. In addition, the invention encompasses configurations exhibiting the same action and effect or configurations capable of achieving the same objects as those of the configurations described in the embodiments. In addition, the invention encompasses configurations obtained by adding known technologies to the configurations described in the embodiments.

REFERENCE SIGNS LIST

10 . . . silicon substrate, 12 . . . silicon oxide film, 14 . . . tungsten film, 20 . . . wiring depression, 42 . . . slurry supply nozzle, 44 . . . slurry (chemical mechanical polishing composition), 46 . . . abrasive cloth, 48 . . . turntable, 50 . . . semiconductor substrate, 52 . . . carrier head, 54 . . . water supply nozzle, 56 . . . dresser, 100 . . . object to be treated, 200 . . . chemical mechanical polishing apparatus

The invention claimed is:

1. A treatment composition for chemical mechanical polishing, comprising:
(A) a nitrogen-containing compound;
(B) at least one compound selected from the group consisting of a surfactant and polyacrylic acid; and
(D) a pH adjusting agent,
wherein in terms of electrode charge transfer resistance value by $\Omega/cm^{-2}$ obtained by AC impedance measurement using a metal, which is contained in a wiring layer of an object to be treated by the treatment composition, as an electrode by
bonding an insulating tape to a central 1 cm×1 cm portion of a metal wafer cut to 1 cm×3 cm,
attaching an electrode clip to an upper 1 cm×1 cm exposed area of the metal wafer,
connecting the metal wafer to a measurement apparatus with a controlled AC voltage,
immersing a lower 1 cm×1 cm exposed area of the metal wafer in an aqueous solution for 5 minutes,
applying an AC voltage having art amplitude of 5 mV and a frequency of from 1,500 Hz to 0.5 Hz changing from a higher frequency to a lower frequency to obtain values for a real part and an imaginary part of a resistance value,
plotting the imaginary part on a vertical axis and the real part on a horizontal axis, and
analyzing the resultant semicircular plot with AC impedance analysis software,
a value (RA+RB) obtained by summing up an electrode charge transfer resistance value (RA) in an aqueous solution containing the component (A) and the pH adjusting agent (D), and an electrode charge transfer resistance value (RB) in an aqueous solution containing the component (B) and the pH adjusting agent (D), a electrode charge transfer r value (RC) in an aqueous solution containing the component (A), the component (B), and the pH adjusting agent (D) satisfy a relationship of RC/(RA+RB)>1.

2. The treatment composition for chemical mechanical polishing according to claim in the nitrogen-containing compound (A) comprises at least one compound selected from the group consisting of a compound represented by formula (1), a compound represented by formula (2), end a compound represented by formula (3):

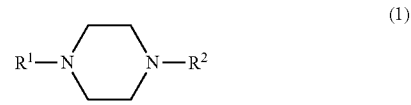

(1)

where $R^1$ and $R^2$ each independently represent a hydrogen atom or an organic group comprising 1 to 10 carbon atoms;

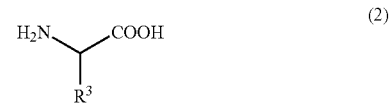

(2)

where $R^3$ represents a functional group selected from the group consisting of a hydrogen atom, an organic group comprising 2 to 10 carbon atoms and a nitrogen atom, and an organic group comprising 1 to 10 carbon atoms and a carboxyl group; and

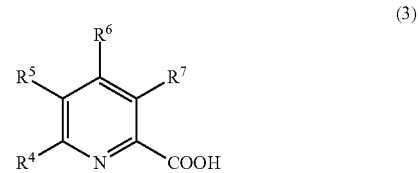

(3)

where one or more of $R^4$ to $R^7$ each independently represent a carboxyl group comprising 1 to 3 carbon atoms, and others of $R^4$ to $R^7$ each represent a hydrogen atom.

3. The treatment composition for chemical mechanical polishing according to claim 2,
wherein the component (A) comprises the compound represented by the formula (1), and
wherein the component (B) comprises an anionic surfactant or a polyacrylic acid.

4. The treatment composition for chemical mechanical polishing according to claim 3, wherein the anionic surfactant comprises at least one selected from the group consisting of potassium dodecylbenzenesulfonate, a dipotassium alkenylsuccinate, and octyl phosphoric acid ester.

5. The treatment composition for chemical mechanical polishing according to claim 2,
wherein the component (A) comprises the compound represented by the formula (2) in which $R^3$ represents an organic group comprising 2 to 10 carbon atoms and a nitrogen atom, and
wherein the component (B) comprises a surfactant comprising a sulfo group.

6. The treatment composition for chemical mechanical polishing according to claim 5, wherein the surfactant comprising a sulfo group comprises an alkylbenzenesulfonic acid or a salt thereof.

7. The treatment composition for chemical mechanical polishing according to claim 2,
wherein the component (A) comprises the compound represented by the formula (2) or the compound represented by the formula (3), and
wherein the component (B) comprises a betaine-based surfactant comprising a carboxyl group.

8. The treatment composition for chemical mechanical polishing according to claim 7, wherein the betaine-based surfactant comprising a carboxyl group comprises at least one selected from the group consisting of a compound represented by formula (4), a compound represented by formula (5), and a compound represented by formula (6):

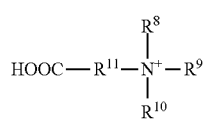 (4)

where $R^8$ to $R^{10}$ each independently represent a hydrocarbon group each comprising 1 to 15 carbon atoms, and $R^{11}$ represents a hydrocarbon group comprising 1 to 5 carbon atoms;

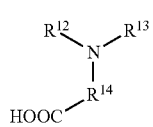 (5)

where $R^{12}$ and $R^{13}$ each independently represent a hydrogen atom, a hydrocarbon group comprising 5 to 20 atoms, an organic group comprising 5 to 20 carbon atoms and an amide group, an organic group comprising 5 to 20 carbon atoms and an amino group, an organic group comprising 5 to 20 carbon atoms and an imide group, an organic group comprising 1 to 10 carbon atoms and a carboxyl group, or an organic group comprising 1 is 10 carbon atoms and a hydroxyl group, and $R^{14}$ represents a hydrocarbon group comprising 1 to 5 carbon atoms; and

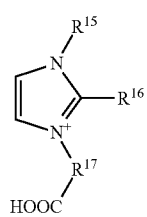 (6)

where $R^{15}$ and $R^{16}$ each independently represent a hydrocarbon group comprising 1 to 20 carbon atoms, or an organic group comprising 1 to 10 carbon atoms and a hydroxyl group, and $R^{17}$ represents a hydrocarbon group comprising 1 to 5 carbon atoms.

9. The treatment composition for chemical mechanical polishing according to claim 8,
wherein the component (A) comprises at least one selected from the group consisting of quinolinic acid, histidine, arginine, and aspartic acid, and
wherein the component (B) comprises at least one selected from the group consisting of lauryldimethylaminoacetic acid betaine, laurylaminodipropionic acid betaine, and 2-lauryl-N-carboxymethyl-N-hydroxyethylimidazolinium betaine.

10. The treatment composition for chemical mechanical polishing according to claim 1, wherein the electrode charge transfer resistance value (RC) is more than 100 kΩ/cm².

11. The treatment composition for chemical mechanical polishing according to claim 1, wherein the metal is tungsten.

12. The treatment composition for chemical mechanical polishing according to claim 1, further comprising an oxidizing agent (C).

13. The treatment composition for chemical mechanical polishing according to claim 12, wherein the oxidizing agent (C) is hydrogen peroxide or ammonium persulfate.

14. The treatment composition for chemical mechanical polishing according to claim 1, wherein the treatment composition for chemical mechanical polishing is a cleaning composition for cleaning the object to be treated.

15. A cleaning method, comprising
cleaning an object with the treatment composition for chemical mechanical polishing of claim 14.

16. The treatment composition for chemical mechanical polishing according to claim 1, further comprising abrasive grains (E).

17. The treatment composition for chemical mechanical polishing according to claim 16, wherein the treatment composition for chemical mechanical polishing is a chemical mechanical polishing composition for polishing the object to be treated.

18. A chemical mechanical polishing method, comprising
polishing an object with the treatment composition for chemical mechanical polishing of claim 17.

* * * * *

UNITED STATES PATENT AND TRADEMARK OFFICE
CERTIFICATE OF CORRECTION

PATENT NO. : 10,507,563 B2
APPLICATION NO. : 15/568285
DATED : December 17, 2019
INVENTOR(S) : Kiyotaka Mitsumoto et al.

Page 1 of 1

It is certified that error appears in the above-identified patent and that said Letters Patent is hereby corrected as shown below:

In the Claims

Column 57, Line 63, Claim 1, "a" should read --and an--;

Column 57, Line 64, Claim 1, "r" should read --resistance--;

Column 58, Line 2, Claim 2, "claim in" should read --claim 1, wherein--;

Column 58, Line 5, Claim 2, "end a" should read --and--;

Column 59, Line 42, Claim 8, "is" should read --to--.

Signed and Sealed this
Ninth Day of June, 2020

Andrei Iancu
*Director of the United States Patent and Trademark Office*